(12) United States Patent
Seto et al.

(10) Patent No.: US 10,305,493 B2
(45) Date of Patent: May 28, 2019

(54) PHASE-LOCKED LOOP AND FREQUENCY SYNTHESIZER

(71) Applicant: SONY SEMICONDUCTOR SOLUTIONS CORPORATION, Kanagawa (JP)

(72) Inventors: Shingo Seto, Kanagawa (JP); Satoshi Suda, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 4 days.

(21) Appl. No.: 15/519,151

(22) PCT Filed: Oct. 1, 2015

(86) PCT No.: PCT/JP2015/077902
§ 371 (c)(1),
(2) Date: Apr. 13, 2017

(87) PCT Pub. No.: WO2016/063700
PCT Pub. Date: Apr. 28, 2016

(65) Prior Publication Data
US 2017/0237443 A1    Aug. 17, 2017

(30) Foreign Application Priority Data
Oct. 22, 2014 (JP) .................. 2014-215271

(51) Int. Cl.
*H03B 21/00* (2006.01)
*H03L 7/081* (2006.01)
(Continued)

(52) U.S. Cl.
CPC ............ *H03L 7/0812* (2013.01); *H03L 7/101* (2013.01); *H03L 7/104* (2013.01); *H03L 7/16* (2013.01); *H03L 7/1806* (2013.01)

(58) Field of Classification Search
None
See application file for complete search history.

(56) References Cited

U.S. PATENT DOCUMENTS 9,014,322 B2 * 4/2015 Nguyen ................ H04L 7/0016
375/354
9,092,067 B2 * 7/2015 Fawley ................. G06F 1/0335
(Continued)

FOREIGN PATENT DOCUMENTS

JP  08-274629 A  10/1996
JP  11-340819 A  12/1999
(Continued)

OTHER PUBLICATIONS

Staszewski, et al., "An All-Digital Offset PLL Architecture", RMO1A-3, IEEE Radio Frequency Integruted Circuits Symposium, 2010, pp. 17-20.
(Continued)

*Primary Examiner* — Lincoln D Donovan
*Assistant Examiner* — Khareem E Almo
(74) *Attorney, Agent, or Firm* — Chip Law Group

(57) ABSTRACT

A phase-locked loop according to the present disclosure includes a reference-phase generation circuit that sequentially generates a reference phase value, and an oscillating circuit that generates a first clock on a basis of a difference between the reference phase value and a feedback phase value. The phase-locked loop further includes a signal generation circuit that generates, on a basis of the first clock, a plurality of second clocks varying in phase, and generates a third clock by switching the plurality of second clocks a plurality of times in each of cycle periods each corresponding to one cycle of the reference clock. The phase-locked loop further includes a phase detection circuit that deter- (Continued)

mines a phase value of the third clock and outputs the determined phase value as the feedback phase value.

15 Claims, 16 Drawing Sheets

(51) Int. Cl.
*H03L 7/16* (2006.01)
*H03L 7/10* (2006.01)
*H03L 7/18* (2006.01)

(56) References Cited

U.S. PATENT DOCUMENTS

| | | | | |
|---|---|---|---|---|
| 2011/0234270 | A1* | 9/2011 | Kobayashi | H03L 7/07 327/156 |
| 2013/0187688 | A1* | 7/2013 | Wang | H03C 5/00 327/156 |
| 2013/0222026 | A1* | 8/2013 | Havens | H03L 7/0995 327/158 |
| 2014/0285245 | A1* | 9/2014 | Sahara | H03L 7/08 327/147 |
| 2014/0285246 | A1* | 9/2014 | Sahara | H03L 7/08 327/147 |
| 2016/0344538 | A1* | 11/2016 | Moehlmann | H03L 7/093 |
| 2017/0366192 | A1* | 12/2017 | Moehlmann | H03L 7/091 |
| 2018/0062662 | A1* | 3/2018 | Pake Talei | H03L 7/0991 |
| 2018/0131545 | A1* | 5/2018 | Mukherjee | H04L 27/22 |
| 2018/0145695 | A1* | 5/2018 | Lahiri | H03L 7/093 |

FOREIGN PATENT DOCUMENTS

| | | |
|---|---|---|
| JP | 2005-328138 A | 11/2005 |
| JP | 2012-257269 A | 12/2012 |

OTHER PUBLICATIONS

Staszewski, et al.,"An All-Digital Offset PLL Architecture", RMOIA-3, IEEE, Radio Frequency Integrated Circuits Symposium, 2010, pp. 17-20.

* cited by examiner

[FIG. 1]
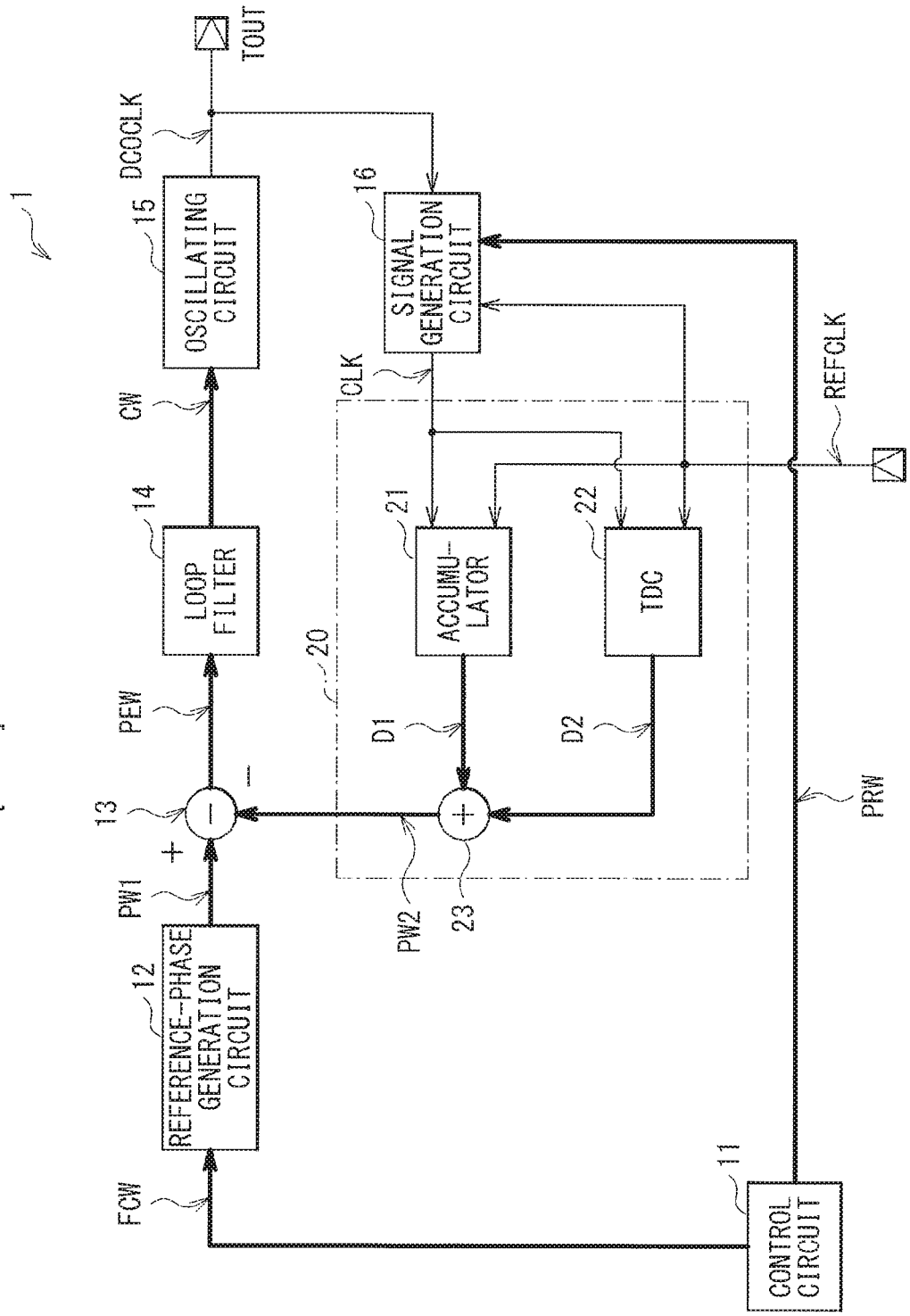

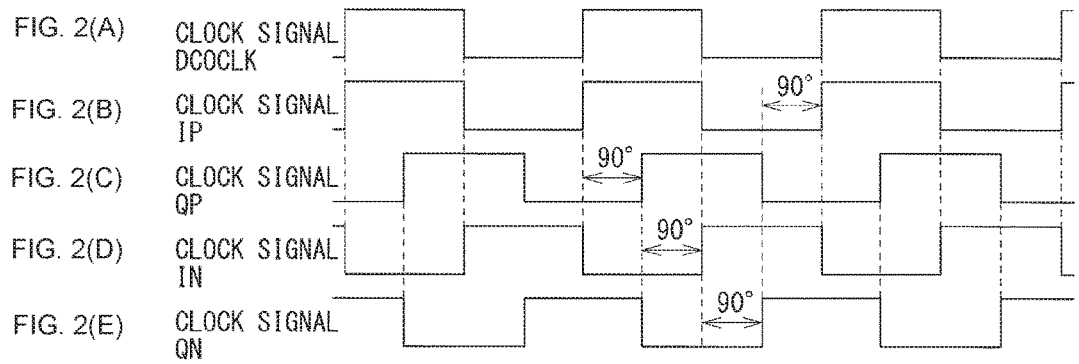
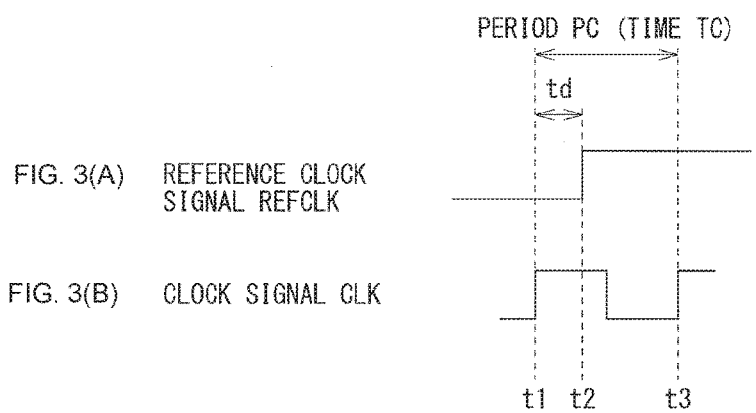
[ FIG. 4 ]
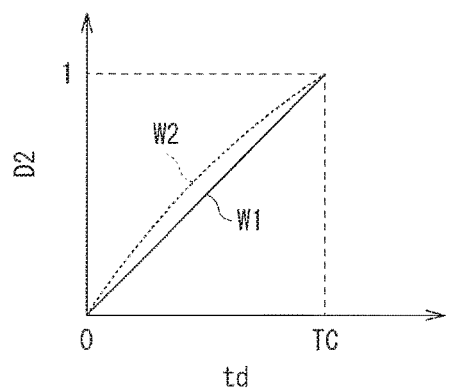

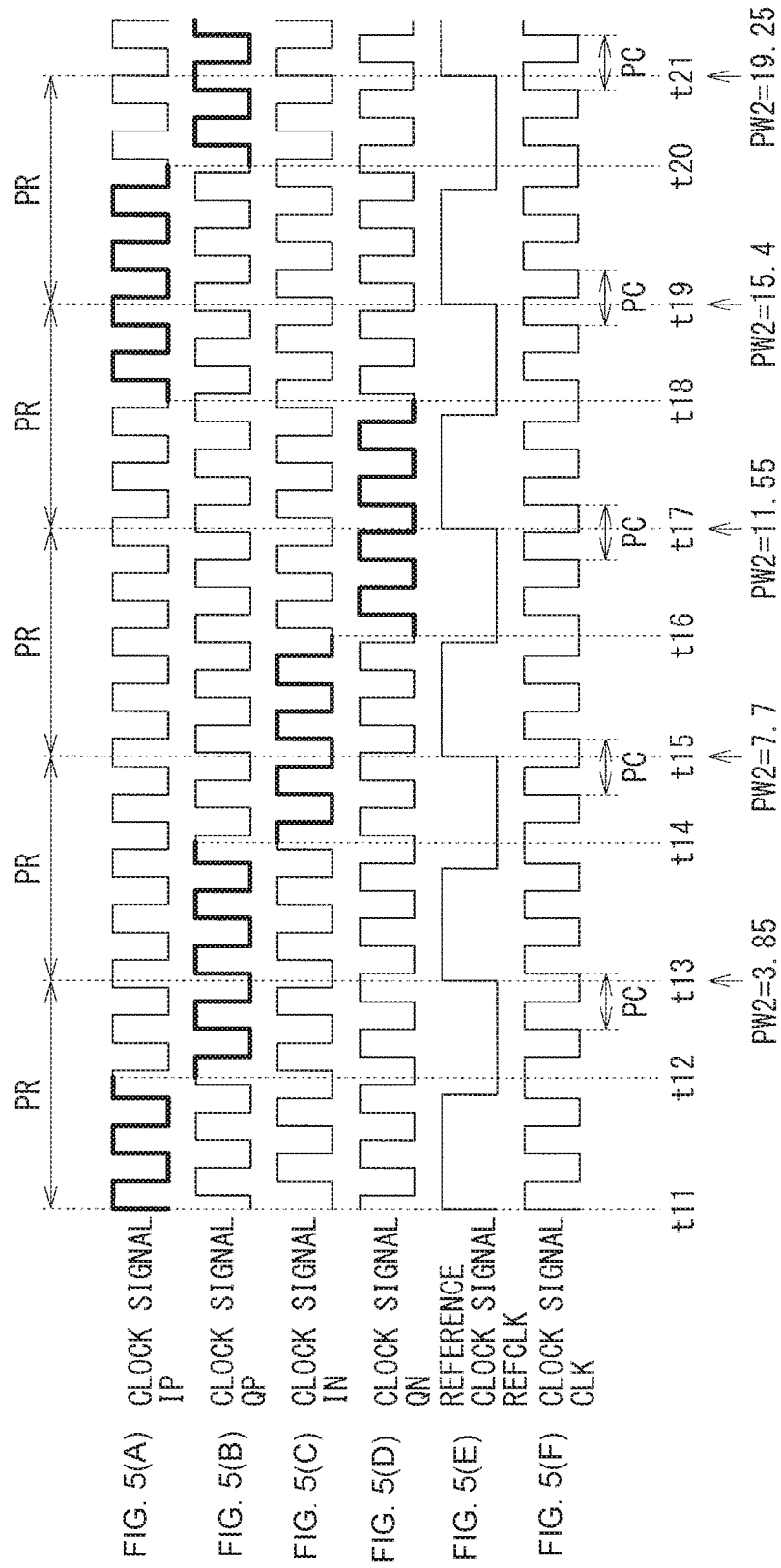

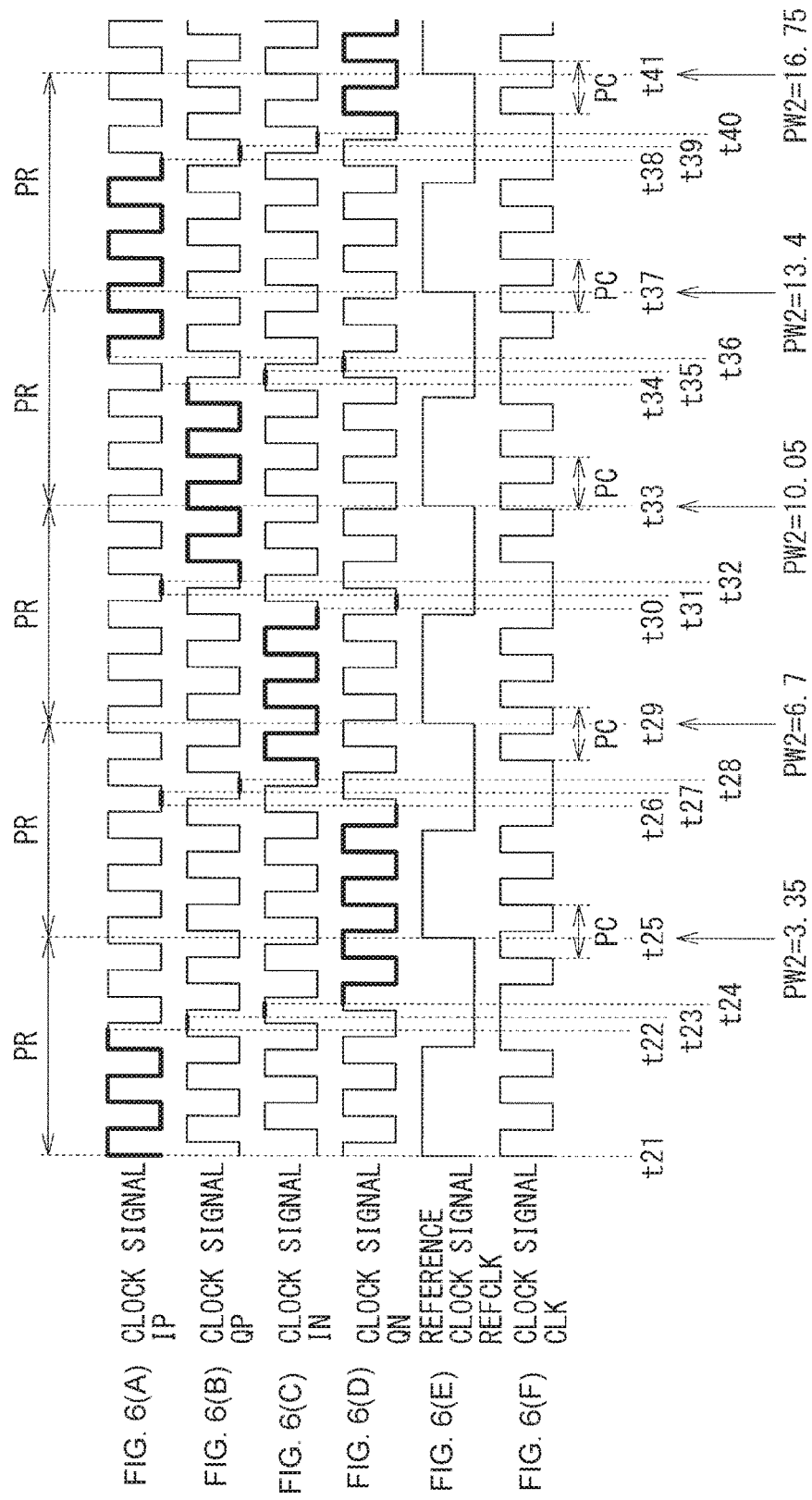

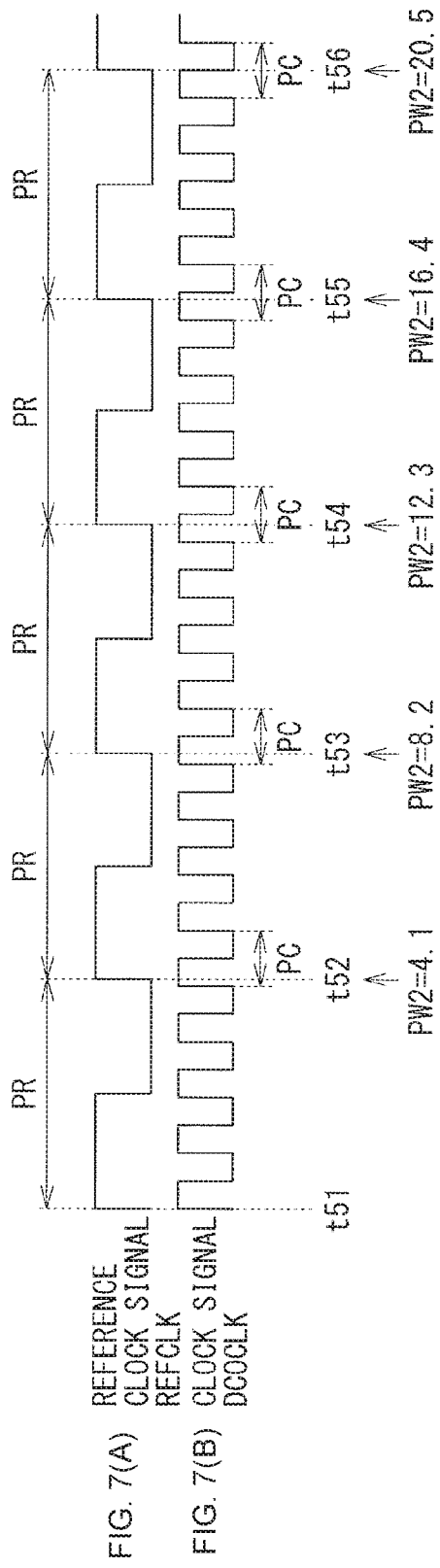

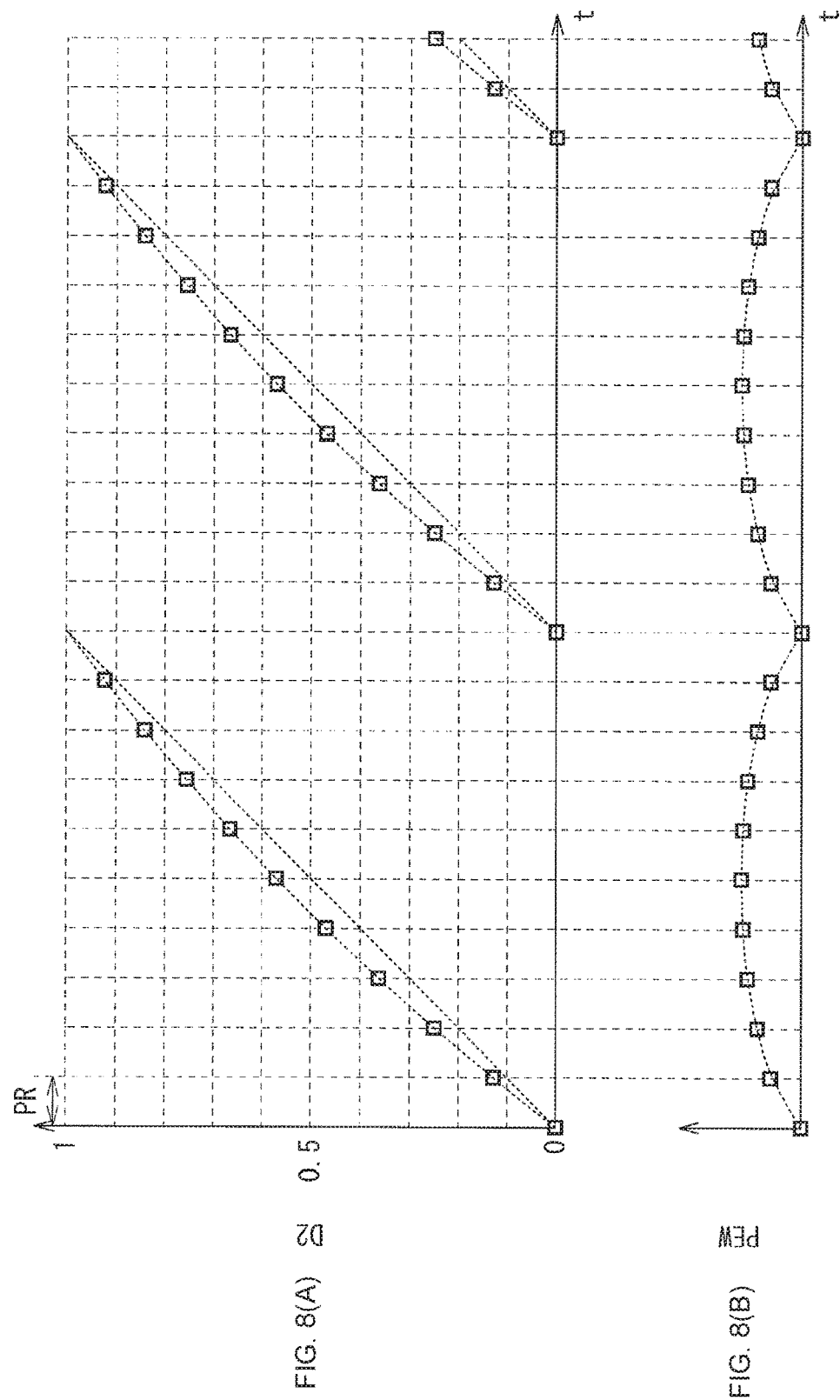

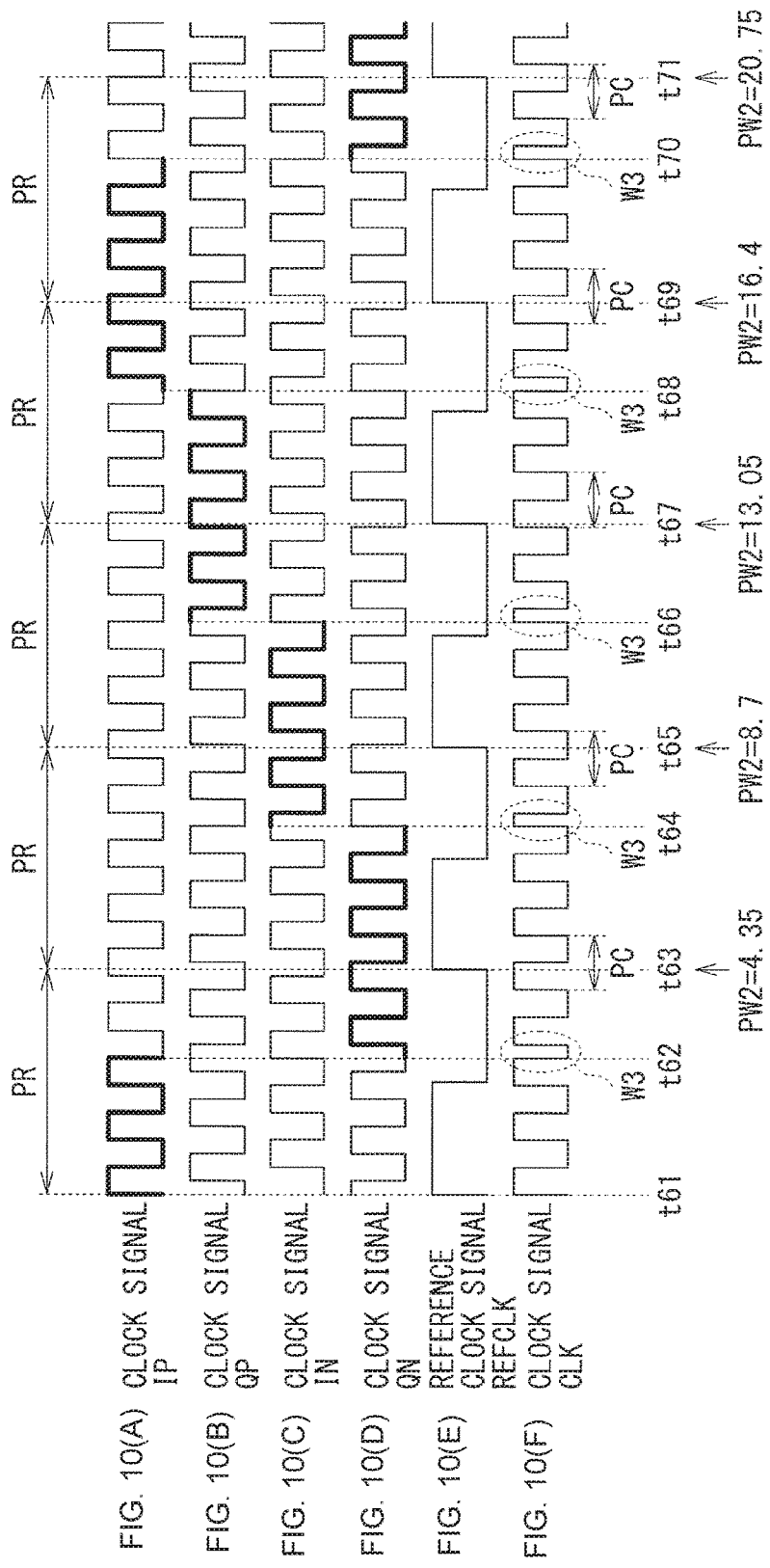

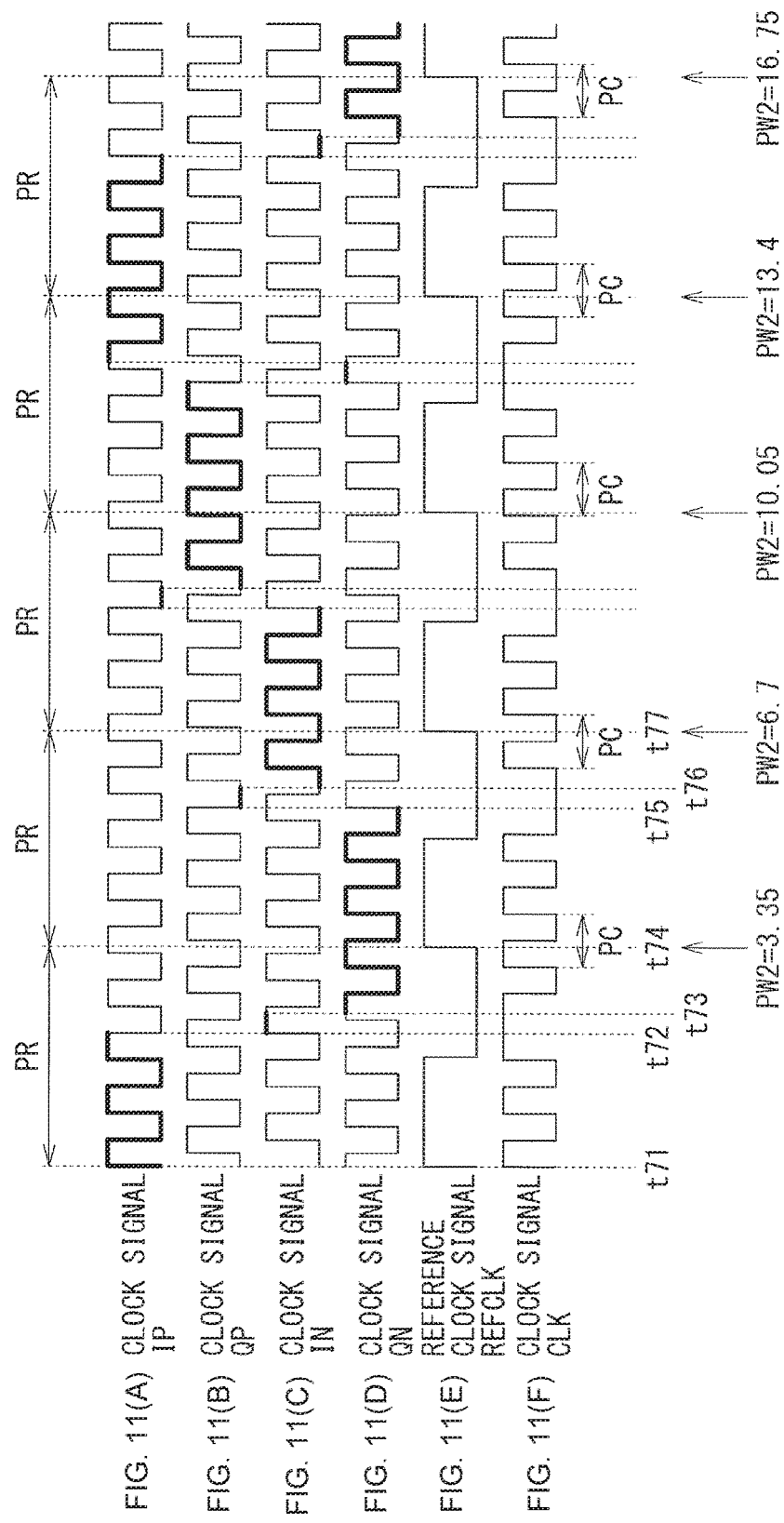

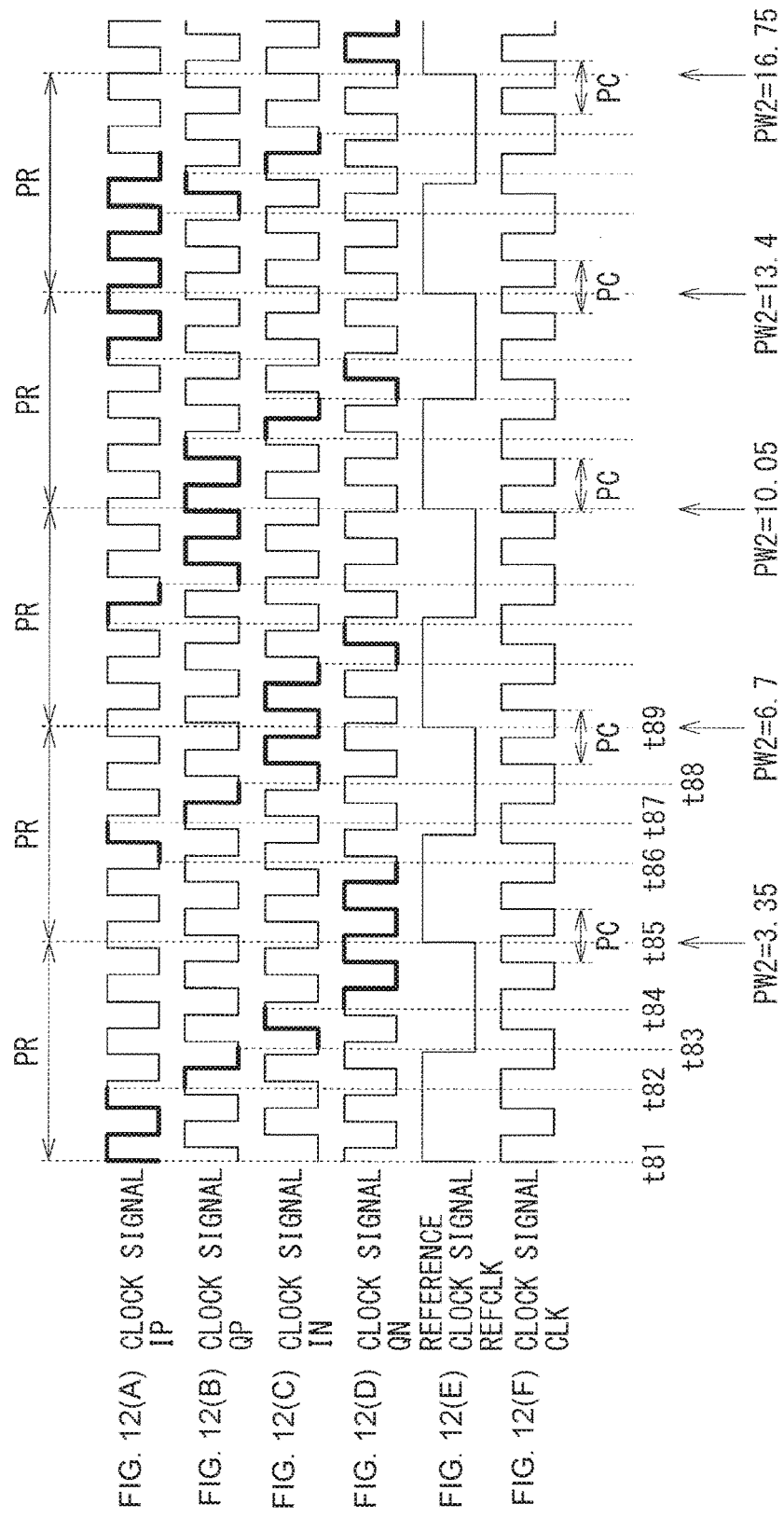

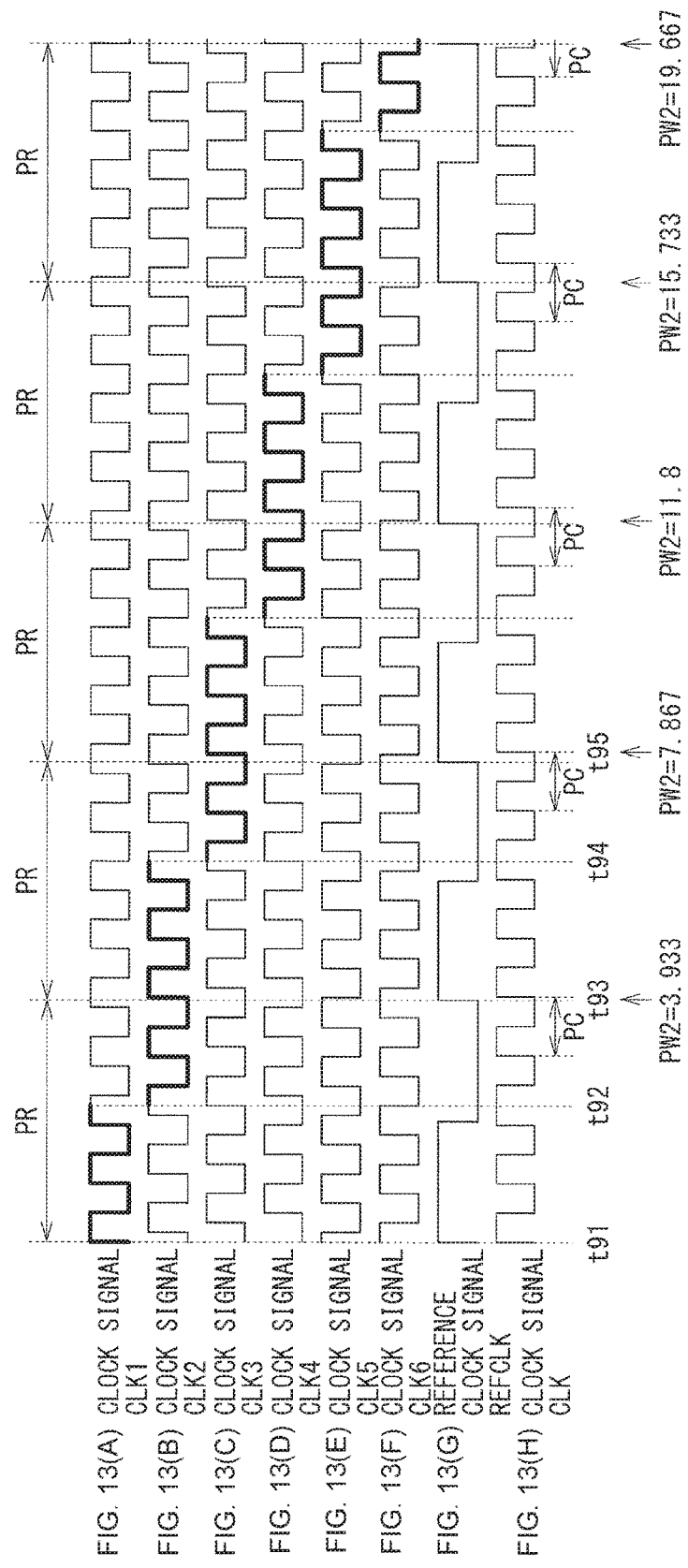

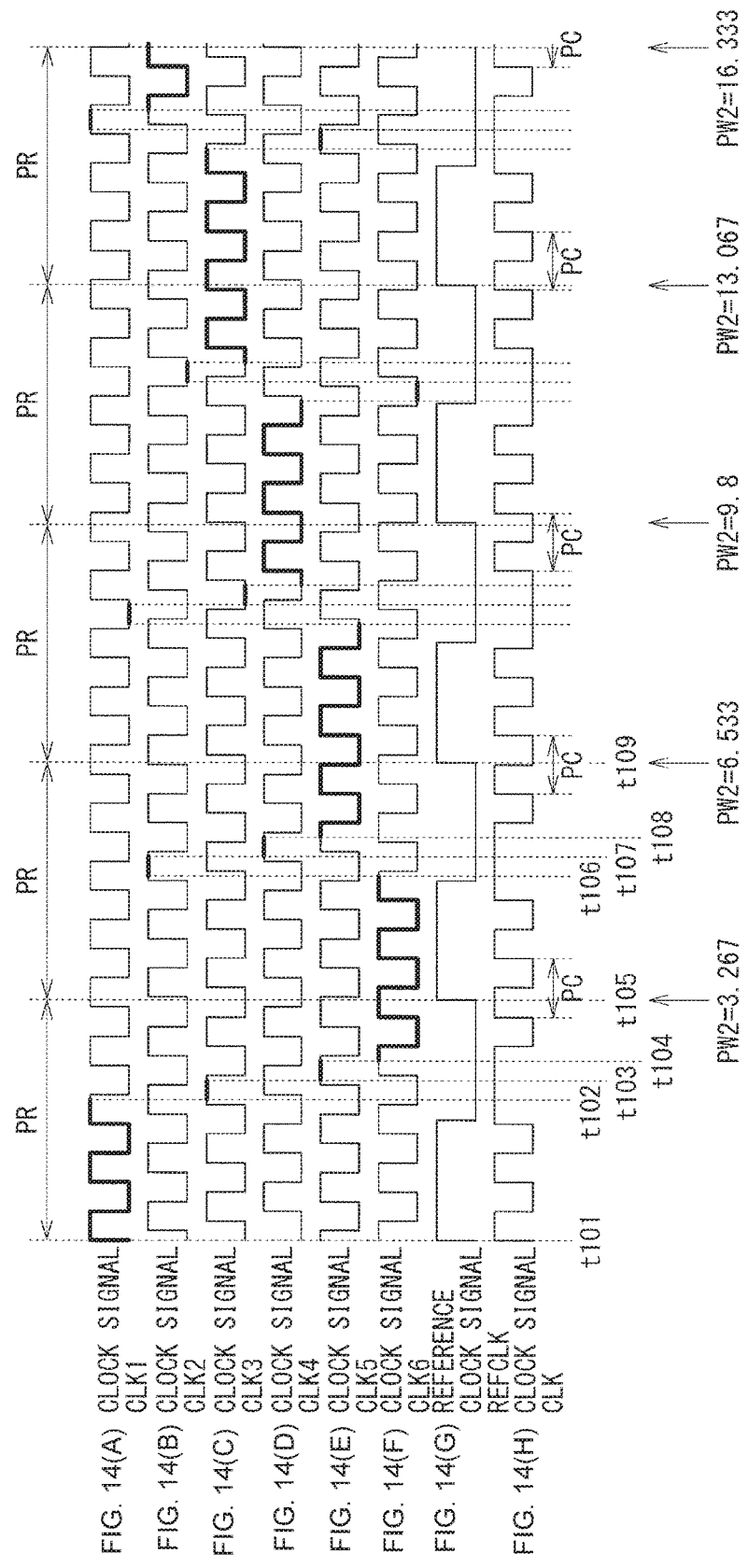

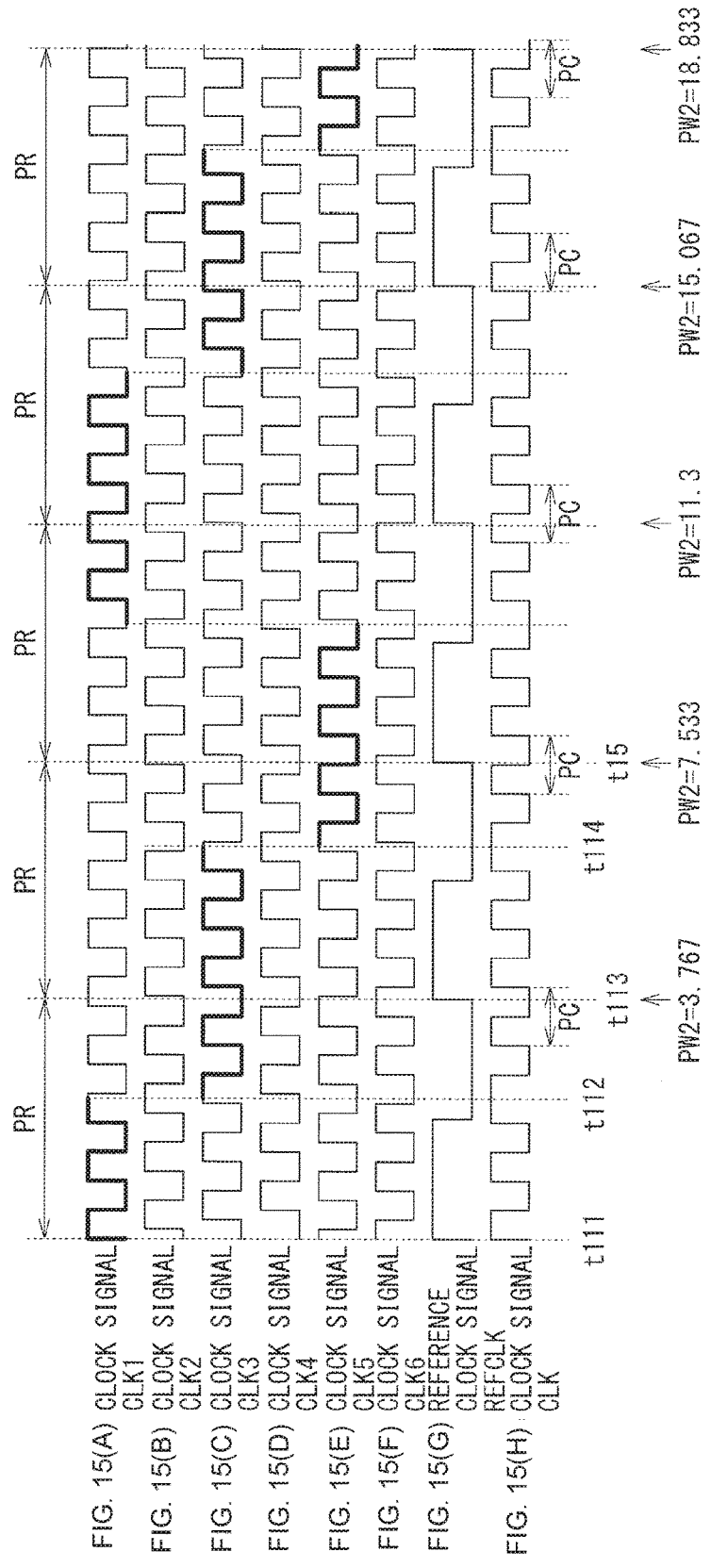

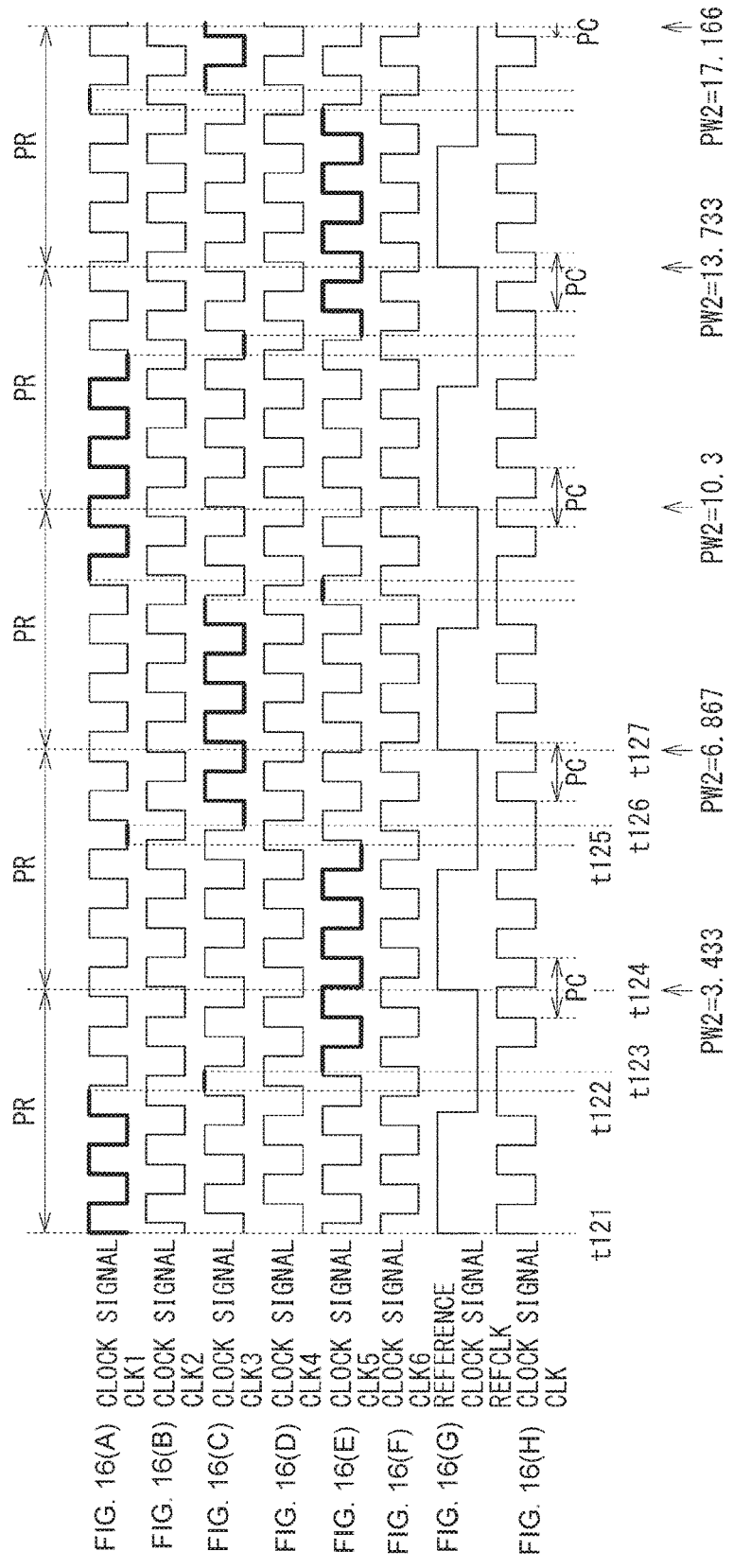

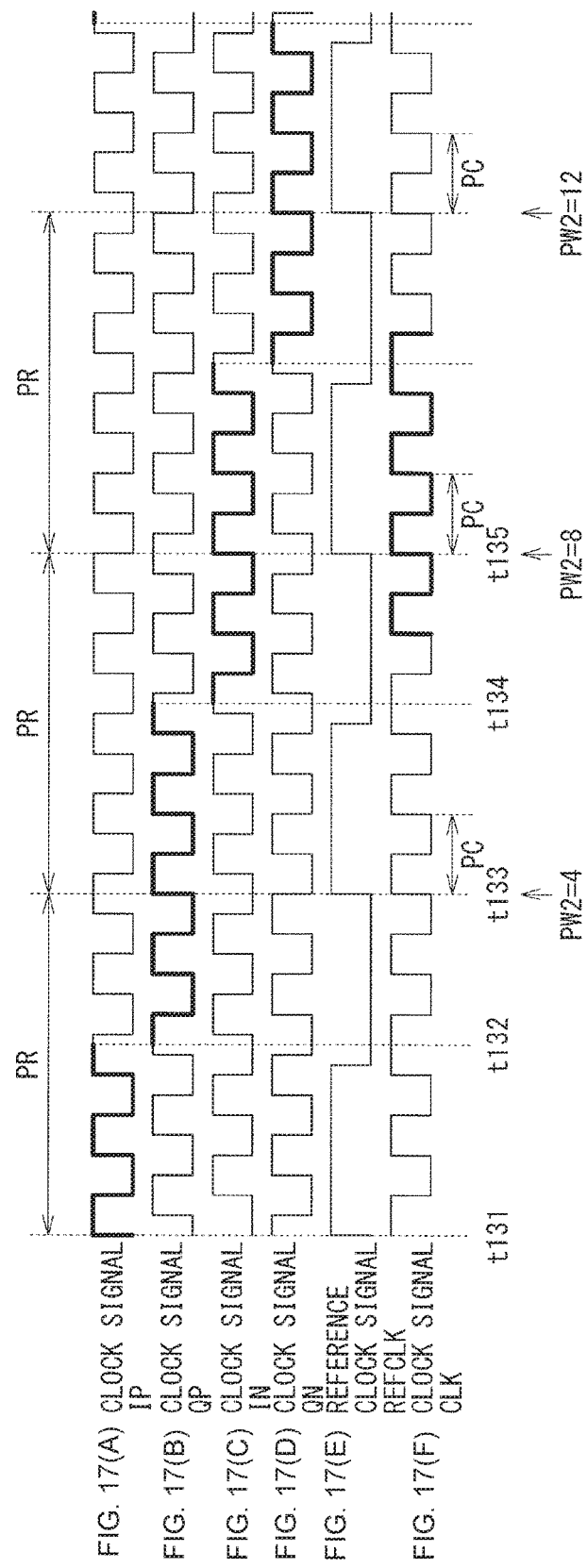

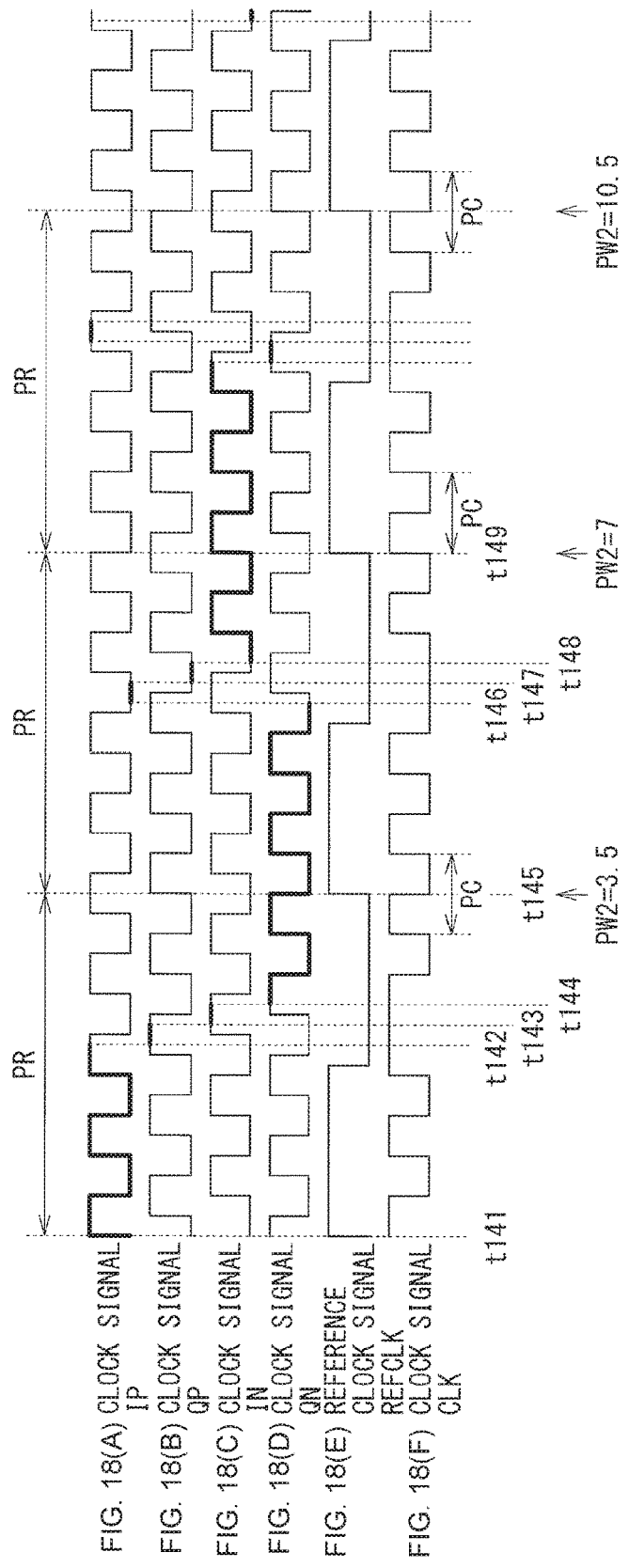

PHASE-LOCKED LOOP AND FREQUENCY SYNTHESIZER

CROSS REFERENCE TO RELATED APPLICATIONS

This application is a U.S. National Phase of International Patent Application No. PCT/JP2015/077902 filed on Oct. 1, 2015, which claims priority benefit of Japanese Patent Application No. JP 2014-215271 filed in the Japan Patent Office on Oct. 22, 2014. Each of the above-referenced applications is hereby incorporated herein by reference in its entirety.

TECHNICAL FIELD

The present disclosure relates to a phase-locked loop operating using a digital signal, and a frequency synthesizer.

BACKGROUND ART

In recent years, various electronic apparatuses have wireless communication functions. A wireless communications system includes a frequency synthesizer (a phase-locked loop) to generate a signal of a desirable frequency. Such a frequency synthesizer includes an analog PLL or a digital PLL (ADPLL; all-digital phase locked loop) (for example, refer to PTL 1 to PTL 3). In a case where the frequency synthesizer includes the digital PLL, it is possible, for example, to reduce a layout area of an integrated circuit and to decrease power consumption, as compared with a case where the frequency synthesizer includes the analog PLL.

For such a digital PLL, various techniques of reducing phase noise of signals to be generated are disclosed. For example, NPL 1 discloses a circuit that generates signals of four phases on the basis of a signal outputted from an oscillating circuit, and feeds back one of the signals of four phases.

CITATION LIST

Patent Literature

PTL 1: Japanese Unexamined Patent Application Publication No. 2011-155601
PTL 2: Japanese Unexamined Patent Application Publication No. 2011-205338
PTL 3: Japanese Unexamined Patent Application Publication No. 2013-176125

Non-Patent Literature

NPL 1: Staszewski, R. B.; Vemulapalli, S.; Waheed, K., "An all-digital offset PLL architecture", Radio Frequency Integrated Circuits Symposium (RFIC), 2010 IEEE, p. 17-20

SUMMARY OF THE INVENTION

As described above, low phase noise is desirable in a frequency synthesizer, and a further reduction in phase noise is expected.

Accordingly, it is desirable to provide a phase-locked loop and a frequency synthesizer that make it possible to reduce phase noise.

A phase-locked loop according to one embodiment of the present disclosure includes a reference-phase generation circuit, an oscillating circuit, a signal generation circuit, and a phase detection circuit. The reference-phase generation circuit sequentially generates a reference phase value. The oscillating circuit generates a first clock on a basis of a difference between the reference phase value and a feedback phase value. The signal generation circuit generates, on a basis of the first clock, a plurality of second clocks varying in phase, and generates a third clock by switching the plurality of second clocks a plurality of times in each of cycle periods each corresponding to one cycle of the reference clock. The phase detection circuit determines a phase value of the third clock and outputs the determined phase value as the feedback phase value.

A frequency synthesizer according to one embodiment of the present disclosure includes a reference-phase generation circuit, an oscillating circuit, a signal generation circuit, and a phase detection circuit. The reference-phase generation circuit sequentially generates a reference phase value. The oscillating circuit generates a first clock on a basis of a difference between the reference phase value and a feedback phase value. The signal generation circuit generates, on a basis of the first clock, a plurality of second clocks varying in phase, and generates a third clock by switching the plurality of second clocks a plurality of times in each of cycle periods each corresponding to one cycle of the reference clock. The phase detection circuit determines a phase value of the third clock and outputs the determined phase value as the feedback phase value.

In the phase-locked loop and the frequency synthesizer according to the respective embodiments of the present disclosure, the reference phase value is sequentially generated. Further, the first clock is generated on the basis of the difference between the reference phase value and the feedback phase value (the phase value of the third clock), and the third clock is generated on the basis of the first clock. At the time, the plurality of second clocks varying in phase are generated on the basis of the first clock, and the third clock is generated by switching the plurality of second clocks the plurality of times in each of the cycle periods.

In the phase-locked loop and the frequency synthesizer according to the respective embodiments of the present disclosure, the plurality of second clocks varying in phase are generated on the basis of the first clock, and the third clock is generated by switching the plurality of second clocks the plurality of times in each of the cycle periods. This makes it possible to reduce phase noise. It is to be noted that effects described here are non-limiting. Effects achieved by the present disclosure may be one or more of effects described in the present disclosure.

BRIEF DESCRIPTION OF THE DRAWINGS

FIG. 1 is a block diagram illustrating a configuration example of a phase-locked loop according to an embodiment of the present disclosure.

FIGS. 2(A), 2(B), 2(C), 2(D) and 2(E) are timing waveform diagrams illustrating an operation example of a signal generation circuit illustrated in FIG. 1.

FIGS. 3(A) and 3(B) are timing waveform diagrams illustrating an operation example of a TDC illustrated in FIG. 1.

FIG. 4 is an explanatory diagram illustrating an example of a conversion characteristic of the TDC illustrated in FIG. 1.

FIGS. 5(A), 5(B), 5(C), 5(D) 5(E) and 5(F) are timing waveform diagrams illustrating an operation example of the phase-locked loop illustrated in FIG. 1.

FIGS. 6(A), 6(B), 6(C), 6(D) 6(E) and 6(F) are timing waveform diagrams illustrating another operation example of the phase-locked loop illustrated in FIG. 1.

FIGS. 7(A) and 7(B) are timing waveform diagrams illustrating an operation example of a phase-locked loop according to a comparative example.

FIGS. 8(A) and 8(B) are explanatory diagrams illustrating another operation example of the phase-locked loop according to the comparative example.

FIGS. 10(A), 10(B), 10(C), 10(D) 10(E) and 10(F) are timing waveform diagrams illustrating an operation example of a phase-locked loop according to another comparative example.

FIGS. 11(A), 11(B), 11(C), 11(D) 11(E) and 11(F) are timing waveform diagrams illustrating an operation example of a phase-locked loop according to a modification example.

FIGS. 12(A), 12(B), 12(C), 12(D) 12(E) and 12(F) are timing waveform diagrams illustrating another operation example of the phase-locked loop according to the modification example.

FIGS. 13(A), 13(B), 13(C), 13(D) 13(E) 13(F), 13(G) and 13(H) are timing waveform diagrams illustrating an operation example of a phase-locked loop according to another modification example.

FIGS. 14(A), 14(B), 14(C), 14(D) 14(E) 14(F), 14(G) and 14(H) are timing waveform diagrams illustrating another operation example of the phase-locked loop according another modification example.

FIGS. 15(A), 15(B), 15(C), 15(D) 15(E) 15(F), 15(G) and 15(H) is a are timing waveform diagrams illustrating an operation example of the phase-locked loop according to another modification example.

FIGS. 16(A), 16(B), 16(C), 16(D) 16(E) 16(F), 16(G) and 16(H) are timing waveform diagrams of the phase-locked loop according to another modification example.

FIGS. 17(A), 17(B), 17(C), 17(D) 17(E) and 17(F) are timing waveform diagrams illustrating an operation example of a phase-locked loop according to another modification example.

FIGS. 18(A), 18(B), 18(C), 18(D) 18(E) and 18(F) are timing waveform diagrams illustrating another operation example of the phase-locked loop according to another modification example.

MODES FOR CARRYING OUT THE INVENTION

Figures 9A, 9B:
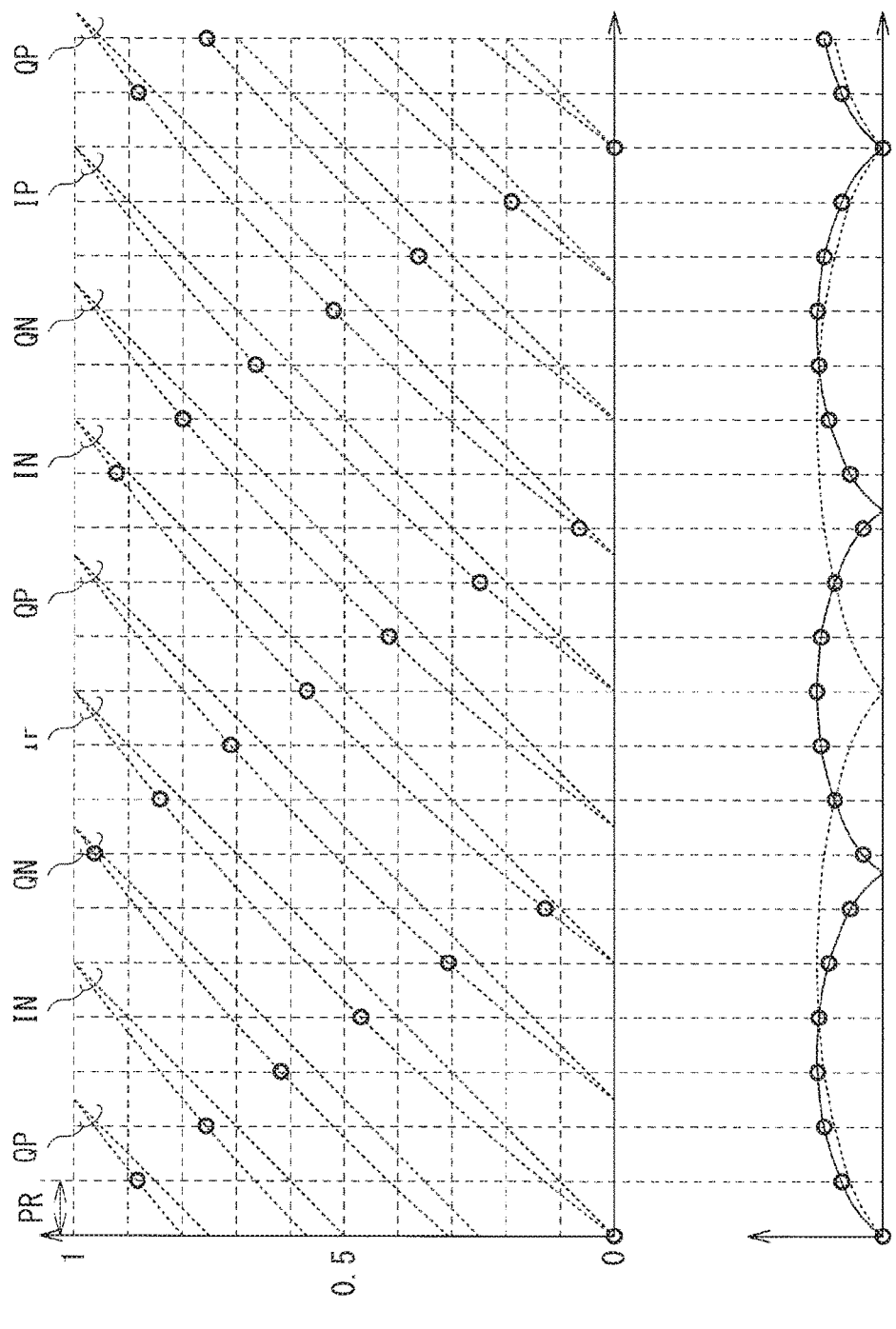
FIGS. 9(A) and 9(B) are explanatory diagrams illustrating another operation example of the phase-locked loop illustrated in FIG. 1.

Embodiments of the present disclosure will be described in detail below with reference to the drawings.

Configuration Example

FIG. 1 illustrates a configuration example of a phase-locked loop (a phase-locked loop 1) according to an embodiment. In FIG. 1, a thick line indicates a so-called bus wiring that conveys a word including a plurality of bits, and a thin line indicates a wiring that conveys one signal or differential signal.

The phase-locked loop 1 is a digital PLL including a digital circuit. The phase-locked loop 1 generates a clock signal DCOCLK on the basis of a reference clock signal REFCLK. A frequency fclk of the clock signal DCOCLK is higher than a frequency fref of the reference clock signal REFCLK. The phase-locked loop 1 includes a control circuit 11, a reference-phase generation circuit 12, a phase comparison circuit 13, a loop filter 14, an oscillating circuit 15, a signal generation circuit 16, and a phase detection circuit 20.

The control circuit 11 generates a frequency control word FCW and supplies the generated frequency control word FCW to the reference-phase generation circuit 12. The control circuit 11 also generates a phase rotation word PRW and supplies the generated phase rotation word PRW to the signal generation circuit 16. On the basis of the frequency control word FCW and the phase rotation word PRW, the control circuit 11 controls the frequency fclk of the clock signal DCOCLK to be generated by the oscillating circuit 15.

The reference-phase generation circuit 12 generates a reference phase word PW1 on the basis of the frequency control word FCW. Specifically, the reference-phase generation circuit 12 generates a reference phase value by accumulating values indicated by the frequency control word FCW. The reference-phase generation circuit 12 outputs the reference phase value as the reference phase word PW1.

The phase comparison circuit 13 generates a phase error word PEW on the basis of the reference phase word PW1 and a phase word PW2. Specifically, the phase comparison circuit 13 determines a phase error value by subtracting a phase value indicated by the phase word PW2 from the reference phase value indicated by the reference phase word PW1. The phase comparison circuit 13 outputs the determined phase error value as the phase error word PEW.

The loop filter 14 generates a control word CW on the basis of the phase error word PEW. Specifically, the loop filter 14 smoothes the phase error value indicated by the phase error word PEW, and outputs the smoothed phase error value as the control word CW.

The oscillating circuit 15 generates the clock signal DCOCLK on the basis of the control word CW. The oscillating circuit 15 then supplies the generated clock signal DCOCLK to the signal generation circuit 16, and outputs the generated clock signal DCOCLK from an output terminal TOUT of the phase-locked loop 1.

The signal generation circuit 16 generates a clock signal CLK on the basis of the clock signal DCOCLK, the reference clock signal REFCLK, and the phase rotation word PRW. Specifically, first, the signal generation circuit 16 generates four clock signals IP, QP, IN, and QN varying in phase on the basis of the clock signal DCOCLK. The signal generation circuit 16 then generates the clock signal CLK by switching these four clock signals IP, QP, IN, and QN.

FIGS. 2(A), 2(B), 2(C), 2(D) and 2(E) illustrate an operation example of the signal generation circuit 16. In FIGS. 2(A), 2(B), 2(C), 2(D) and 2(E), FIG. 2(A) indicates a waveform of the clock signal DCOCLK, and FIG. 2(B) to FIG. 2(E) indicate waveforms of the clock signals IP, QP, IN, and QN, respectively. In this example, the clock signal IP is in phase with the clock signal DCOCLK. The clock signal QP is lagged in phase behind the clock signal IP by 90 degrees (a ¼ cycle), and the clock signal IN is lagged in phase behind the clock signal QP by 90 degrees. The clock signal QN is lagged in phase behind the clock signal IN by 90 degrees, and leads the clock signal IP in phase by 90 degrees.

On the basis of the reference clock signal REFCLK and the phase rotation word PRW, the signal generation circuit 16 sequentially selects one of the four clock signals IP, QP, IN, and QN, thereby generating the clock signal CLK.

Specifically, for example, when a value of the phase rotation word PRW is "+¼", the signal generation circuit 16 may select a new clock signal lagged in phase by a ¼ cycle behind the clock signal selected from the four clock signals IP, QP, IN, and QN, in each of periods PR corresponding to one cycle of the reference clock signal REFCLK. In other words, for example, the signal generation circuit 16 may select the clock signal QP as a new clock signal when the clock signal IP is selected, and the signal generation circuit 16 may select the clock signal IN as a new clock signal when the clock signal QP is selected. Further, the signal generation circuit 16 may select the clock signal QN as a new clock signal when the clock signal IN is selected, and the signal generation circuit 16 may select the clock signal IP as a new clock signal when the clock signal QN is selected. The signal generation circuit 16 may thus switch the clock signals.

In addition, for example, when a phase rotation value P is "−¼", the signal generation circuit 16 may select a new clock signal leading, in phase by a ¼ cycle, the clock signal selected from the four clock signals IP, QP, IN, and QN, in each of the periods PR. In other words, for example, the signal generation circuit 16 may select the clock signal QN as a new clock signal when the clock signal IP is selected, and the signal generation circuit 16 may select the clock signal IP as a new clock signal when the clock signal QP is selected. Further, the signal generation circuit 16 may select the clock signal QP as a new clock signal when the clock signal IN is selected, and the signal generation circuit 16 may select the clock signal IN as a new clock signal when the clock signal QN is selected. The signal generation circuit 16 may thus switch the clock signals. Moreover, when the phase rotation value P is "−¼" as described above, the signal generation circuit 16 may select a new clock signal leading in phase by a ¼ cycle, by switching the clock signals a plurality of times, in each of the periods PR. This will be described later.

The phase detection circuit 20 detects a phase of the clock signal CLK on the basis of the clock signal CLK and the reference clock signal REFCLK. The phase detection circuit 20 then outputs a result of this detection as the phase word PW2. The phase detection circuit 20 has an accumulator 21, a TDC (time to digital converter) 22, and an adding circuit 23.

The accumulator 21 acquires an integer portion of a phase value of the clock signal CLK by counting number of pulses of the clock signal CLK. The accumulator 21 then outputs the acquired integer portion as a phase word D1.

The TDC 22 acquires a decimal portion of the phase value of the clock signal CLK by making a comparison between a transition timing of the clock signal CLK and a transition timing of the reference clock signal REFCLK. The TDC 22 then outputs the acquired decimal portion as a phase word D2.

FIGS. 3(A) and 3(B) illustrate an input signal of the TDC 22. In FIGS. 3(A) and 3(B), FIG. 3(A) indicates a waveform of the reference clock signal REFCLK, and FIG. 3(B) indicates a waveform of the clock signal CLK. FIG. 4 illustrates an example of a conversion characteristic of the TDC 22. The TDC 22 determines a position of a rising timing of the reference clock signal REFCLK, in a period PC (a time TC) corresponding to one cycle of the clock signal CLK. Specifically, the TDC 22 outputs, as the phase word D2, a value that corresponds to a time td from a rising timing t1 of the clock signal CLK to a rising timing t2 of the reference clock signal REFCLK. The value of the phase word D2 is 0 or more and less than 1, and increases with the time td, as illustrated in FIG. 4. The conversion characteristic of the TDC 22 may be desirably a linear characteristic as indicated by a characteristic W1, but may have nonlinearity indicated by a characteristic W2. The phase-locked loop 1 includes the signal generation circuit 16. This makes it possible to reduce likelihood of increase in phase noise of the clock signal DCOCLK, even if the TDC 22 has a nonlinear conversion characteristic, as will be described later.

The adding circuit 23 generates the phase word PW2 on the basis of the phase words D1 and D2. In other words, the phase word D1 indicates the integer portion of the phase value of the clock signal CLK, and the phase word D2 indicates the decimal portion of the phase value of the clock signal CLK. The adding circuit 23 therefore determines the phase value of the clock signal CLK by adding the value indicated by the phase word D1 and the value indicated by the phase word D2. The adding circuit 23 then outputs a result of this addition as the phase word PW2.

Here, the clock signal DCOCLK corresponds to a specific example of a "first clock" in the present disclosure, the clock signals IP, QP, IN, and QP correspond to a specific example of a "plurality of second clocks" in the present disclosure, and the clock signal CLK corresponds to a specific example of a "third clock" in the present disclosure. The reference clock signal REFCLK corresponds to a specific example of a "reference clock" in the present disclosure. The value of the reference phase word PW1 corresponds to a specific example of a "reference phase value" in the present disclosure, and the value of the phase word PW2 corresponds to a specific example of a "feedback phase value" in the present disclosure. The period PR corresponds to a specific example of a "cycle period" in the present disclosure.

[Operation and Workings]

Next, operation and workings of the phase-locked loop 1 of the present embodiment will be described.

(Outline of Overall Operation)

First, an outline of overall operation of the phase-locked loop 1 will be described with reference to FIG. 1. The control circuit 11 generates the frequency control word FCW and the phase rotation word PRW. The reference-phase generation circuit 12 generates the reference phase word PW1 on the basis of the frequency control word FCW. The phase comparison circuit 13 generates the phase error word PEW on the basis of the reference phase word PW1 and the phase word PW2. The loop filter 14 generates the control word CW on the basis of the phase error word PEW. The oscillating circuit 15 generates the clock signal DCOCLK on the basis of the control word CW.

The signal generation circuit 16 generates the clock signal CLK on the basis of the clock signal DCOCLK, the reference clock signal REFCLK, and the phase rotation word PRW. Specifically, first, the signal generation circuit 16 generates the four clock signals IP, QP, IN, and QN varying in phase on the basis of the clock signal DCOCLK. The signal generation circuit 16 then generates the clock signal CLK by switching these four clock signals IP, QP, IN, and QN.

The phase detection circuit 20 detects the phase of the clock signal CLK on the basis of the clock signal CLK and the reference clock signal REFCLK. The phase detection circuit 20 then outputs a result of this detection as the phase word PW2. Specifically, the accumulator 21 acquires the integer portion of the phase value of the clock signal CLK by counting number of pulses of the clock signal CLK. The accumulator 21 then outputs the acquired integer portion as the phase word D1. The TDC 22 acquires the decimal portion of the phase value of the clock signal CLK by making a comparison between the transition timing of the clock signal CLK and the transition timing of the reference clock signal REFCLK. The TDC 22 then outputs the acquired decimal portion as the phase word D2. The adding circuit 23 generates the phase word PW2 by adding the value indicated by the phase word D1 and the value indicated by the phase word D2.

(Detailed Operation)

Next, the operation of the phase-locked loop 1 will be described in detail with reference to some examples. Here, a case where a frequency ratio fratio is "4.1" will be described as an example. The frequency ratio fratio is a value determined by dividing the frequency fclk of the clock signal DCOCLK by the frequency fref of the reference clock signal REFCLK.

Operation Example 1

FIGS. 5(A), 5(B), 5(C), 5(D) 5(E) and 5(F) illustrate an operation example of the phase-locked loop 1. In FIGS. 5(A), 5(B), 5(C), 5(D) 5(E) and 5(F), FIG. 5(A) to FIG. 5(D) indicate waveforms of the four clock signals IP, QP, IN, and QN, respectively. Further, FIG. 5(E) indicates a waveform of the reference clock signal REFCLK, and FIG. 5(F) indicates a waveform of the clock signal CLK. In FIG. 5(A) to FIG. 5(D), a thick line indicates a waveform portion selected by the signal generation circuit 16. In this example, the control circuit 11 sets "3.85" as the value of the frequency control word FCW, and sets "+¼" as the value of the phase rotation word PRW.

The signal generation circuit 16 generates the four clock signals IP, QP, IN, and QN on the basis of the clock signal DCOCLK. The signal generation circuit 16 generates the clock signal CLK by switching these clock signals IP, QP, IN, and QN. The phase detection circuit 20 detects the phase of the clock signal CLK on the basis of the clock signal CLK and the reference clock signal REFCLK. This operation will be described in detail below.

First, at a timing t11, the period PR corresponding to one cycle of the reference clock REFCLK begins. The signal generation circuit 16 switches the clock signals once, in a period from the timing t11 to a timing t13. Specifically, in a period from the timing t11 to a timing t12, the signal generation circuit 16 selects the clock signal IP, and outputs the selected clock signal IP as the clock signal CLK.

Subsequently, at the timing t12, the signal generation circuit 16 switches from the clock signal IP to the clock signal QP (see FIGS. 5(A), 5(B) and 5(F)).

Next, the period PR ends at the timing t13, and the phase detection circuit 20 detects the phase of the clock signal and then outputs the detected phase as the phase word PW2. At this moment, since the number of pulses of the clock signal CLK in the period from the timing t11 to the timing t13 is "3", the accumulator 21 outputs the phase word D1 indicating a value "3". In addition, the TDC 22 determines the position of the rising timing (the timing t13) of the reference clock signal REFCLK, in the period PC corresponding to one cycle of the clock signal CLK. In this example, the TDC 22 outputs the phase word D2 indicating a value "0.85". As a result, the phase detection circuit 20 generates the phase word PW2 indicating a value "3.85" (=3+0.85).

The reference-phase generation circuit 12 generates the reference phase word PW1 on the basis of the frequency control word FCW. In this example, since the frequency control word FCW is "3.85", a value indicated by the reference phase word PW1 is "3.85" (=3.85×1), at the timing t13. Hence, the phase comparison circuit 13 generates the phase error word PEW having the value "0" by determining a difference between the value "3.85" of the reference phase word PW1 and the value "3.85" of the phase word PW2. This maintains phase synchronization in the phase-locked loop 1.

In addition, at the timing t13, a new period PR begins, and the signal generation circuit 16 switches from the clock signal QP to the clock signal IN at a timing t14 (see FIGS. 5(B), 5(C) and 5(F)).

Next, the period PR ends at a timing t15. At this moment, since the number of pulses of the clock signal CLK in a period from the timing t11 to the timing t15 is "7", the accumulator 21 outputs the phase word D1 indicating a value "7". In addition, in this example, the TDC 22 outputs the phase word D2 indicating a value "0.7". As a result, the phase detection circuit 20 generates the phase word PW2 indicating a value "7.7" (=7+0.7). At the timing t15, the value indicated by the reference phase word PW1 is "7.7" (=3.85×2). Hence, the phase comparison circuit 13 generates the phase error word PEW having the value "0" by determining a difference between the value "7.7" of the reference phase word PW1 and the value "7.7" of the phase word PW2. This maintains the phase synchronization in the phase-locked loop 1.

In addition, at the timing t15, a new period PR begins, and the signal generation circuit 16 switches from the clock signal IN to the clock signal QN at a timing t16 (see FIGS. 5(C), 5(D) and 5(F)).

Next, at a timing t17, the period PR ends, and the phase detection circuit 20 generates the phase word PW2 indicating a value "11.55" (=11+0.55). At the timing t17, the value indicated by the reference phase word PW1 is "11.55" (=3.85×3). Hence, the phase comparison circuit 13 generates the phase error word PEW having of the value "0" by determining a difference between the value "11.55" of the reference phase word PW1 and the value "11.55" of the phase word PW2. This maintains the phase synchronization in the phase-locked loop 1.

In addition, at the timing t17, a new period PR begins, and the signal generation circuit 16 switches from the clock signal QN to the clock signal IP at a timing t18 (see FIGS. 5(A), 5(D) and 5(F)).

Next, at a timing t19, the period PR ends, and the phase detection circuit 20 generates the phase word PW2 indicating a value "15.4" (=15+0.4). At the timing t19, the value indicated by the reference phase word PW1 is "15.4" (=3.85×4). Hence, the phase comparison circuit 13 generates the phase error word PEW having the value "0" by determining a difference between the value "15.4" of the reference phase word PW1 and the value "15.4" of the phase word PW2. This maintains the phase synchronization in the phase-locked loop 1.

Further, at the timing t19, a new period PR begins, and the signal generation circuit 16 switches from the clock signal IP to the clock signal QP at a timing t20 (see FIGS. 5(A), 5(B) and 5(F)).

Next, at a timing t21, the period PR ends, and the phase detection circuit 20 generates the phase word PW2 indicating a value "19.25" (=19+0.25). At the timing t21, the value indicated by the reference phase word PW1 is "19.25" (=3.85×5). Hence, the phase comparison circuit 13 generates the phase error word PEW having the value "0" by determining a difference between the value "19.25" of the reference phase word PW1 and the value "19.25" of the phase word PW2. This maintains the phase synchronization in the phase-locked loop 1.

In this way, in the phase-locked loop 1, the signal generation circuit 16 generates the clock signal CLK by switching the four clock signals IP, QP, IN, and QN sequentially, and the phase detection circuit 20 detects the phase of the generated clock signal CLK. This makes it possible to reduce the phase noise, even if the TDC 22 has the nonlinear conversion characteristic, as will be described later as compared with a comparative example 1.

Operation Example 2

FIGS. 6(A), 6(B), 6(C), 6(D) 6(E) and 6(F) illustrate another operation example of the phase-locked loop 1. In this example, the control circuit 11 sets "3.35" as the value of the frequency control word FCW, and sets "-¼" as the value of the phase rotation word PRW.

First, at the timing t21, the period PR corresponding to one cycle of the reference clock REFCLK begins. The signal generation circuit 16 switches the clock signals three times in a period from the timing t21 to a timing t25. Specifically, in a period from the timing t21 to a timing t22, the signal generation circuit 16 selects the clock signal IP and outputs the selected clock signal IP as the clock signal CLK. At the timing t22, the signal generation circuit 16 switches from the clock signal IP to the clock signal QP. At a timing t23, the signal generation circuit 16 switches from the clock signal QP to the clock signal IN. At a timing t24, the signal generation circuit 16 switches from the clock signal IN to the clock signal QN (see FIGS. 6(A) to 6(D) and 6(F)).

Next, at the timing t25, the period PR ends, and the phase detection circuit 20 generates the phase word PW2 indicating a value "3.35" (=3+0.35). At the timing t25, the value indicated by the reference phase word PW1 is "3.35" (=3.35×1). Hence, the phase comparison circuit 13 generates the phase error word PEW having the value "0" by determining a difference between the value "3.35" of the reference phase word PW1 and the value "3.35" of the phase word PW2. This maintains the phase synchronization in the phase-locked loop 1.

In addition, at the timing t25, a new period PR begins, and the signal generation circuit 16 switches from the clock signal QN to the clock signals IP, QP, and IN sequentially in this order, at timings t26, t27, and t28, respectively (see FIGS. 6(A) to 6(D) and 6(F) of FIG. 6)).

Next, at a timing t29, the period PR ends, and the phase detection circuit 20 generates the phase word PW2 indicating a value "6.7" (=6+0.7). At the timing t29, the value indicated by the reference phase word PW1 is "6.7" (=3.35×2). Hence, the phase comparison circuit 13 generates the phase error word PEW having the value "0" by determining a difference between the value "6.7" of the reference phase word PW1 and the value "6.7" of the phase word PW2. This maintains the phase synchronization in the phase-locked loop 1.

In addition, at the timing t29, a new period PR begins, and the signal generation circuit 16 switches from the clock signal IN to the clock signals QN, IP, and QP sequentially in this order, at timings t30, t31, and t32, respectively (see FIGS. 6(A) to 6(D) and 6(F)).

Next, at a timing t33, the period PR ends, and the phase detection circuit 20 generates the phase word PW2 indicating a value "10.05" (=10+0.05). At the timing t33, the value indicated by the reference phase word PW1 is "10.05" (=3.35×3). Hence, the phase comparison circuit 13 generates the phase error word PEW having the value "0" by determining a difference between the value "10.05" of the reference phase word PW1 and the value "10.05" of the phase word PW2. This maintains the phase synchronization in the phase-locked loop 1.

In addition, at the timing t33, a new period PR begins, and the signal generation circuit 16 switches from the clock signal QP to the clock signals IN, QN, and IP sequentially in this order, at timings t34, t35, and t36, respectively (see FIGS. 6(A) to 6(D) and 6(F)).

Next, at a timing t37, the period PR ends, and the phase detection circuit 20 generates the phase word PW2 indicating a value "13.4" (=13+0.4). At the timing t37, the value indicated by the reference phase word PW1 is "13.4" (=3.35×4). Hence, the phase comparison circuit 13 generates the phase error word PEW having the value "0" by determining a difference between the value "13.4" of the reference phase word PW1 and the value "13.4" of the phase word PW2. This maintains the phase synchronization in the phase-locked loop 1.

In addition, at the timing t37, a new period PR begins, and the signal generation circuit 16 switches from the clock signal IP to the clock signals QP, IN, and QN sequentially in this order, at timings t38, t39, and t40, respectively (see FIGS. 6(A) to 6(D) and 6(F)).

Next, at a timing t41, the period PR ends, and the phase detection circuit 20 generates the phase word PW2 indicating a value "16.75" (=6+0.75). At the timing t41, the value indicated by the reference phase word PW1 is "16.75" (=3.35×5). Hence, the phase comparison circuit 13 generates the phase error word PEW having the value "0" by determining a difference between the value "16.75" of the reference phase word PW1 and the value "16.75" of the phase word PW2. This maintains the phase synchronization in the phase-locked loop 1.

In this way, in the phase-locked loop 1, the signal generation circuit 16 switches the clock signals a plurality of times (in this example, three times), when the value of the phase rotation word PRW is "-¼". Specifically, the signal generation circuit 16 switches the clock signals in order of IP, QP, IN, QN, and so on, in each of the periods PR. This makes it possible to reduce likelihood of decrease in pulse width in the clock signal CLK, as will be described below, as compared with a comparative example 2. This allows for a reduction in likelihood of malfunction of the phase detection circuit 20, and therefore makes it possible to reduce the phase noise.

Next, workings of the present embodiment will be described, as compared with each of some comparative examples.

Comparative Example 1

A phase-locked loop 1R according to the comparative example 1 is equivalent to a circuit configured by removing the signal generation circuit 16 from the phase-locked loop 1 according to the present embodiment. In other words, in the comparative example 1, the phase detection circuit 20 detects the phase of the clock signal CLK on the basis of the clock signal DCOCLK and the reference clock signal REFCLK, and outputs a result of this detection as the phase word PW2. Other configurations are similar to those of the present embodiment (see FIG. 1).

FIGS. 7(A) and 7(B) illustrate operation of the phase-locked loop 1R. In FIGS. 7(A) and 7(B), FIG. 7(A) indicates a waveform of the reference clock signal REFCLK, and FIG. 7(B) indicates a waveform of the clock signal DCOCLK. In this example, a frequency control word generation circuit 11 sets "4.1" as the frequency control word FCW.

First, the period PR corresponding to one cycle of the reference clock REFCLK begins at a timing t51. The period PR then ends at a timing t52. The phase detection circuit 20 generates the phase word PW2 indicating a value "4.1" (=4+0.1). At the timing t52, the value indicated by the reference phase word PW1 is "4.1" (=4.1×1). Hence, the phase comparison circuit 13 generates the phase error word PEW having the value "0" by determining a difference between the value "4.1" of the reference phase word PW1 and the value "4.1" of the phase word PW2. This maintains the phase synchronization in the phase-locked loop 1R.

Operation is similarly performed at the timing t52 and thereafter. The value of the reference phase word PW1 increases from 4.1, to 8.2, 12.3, 16.4, 20.5, and so on. Similarly, the value of the phase word PW2 increases from 4.1 to 8.2, 12.3, 16.4, 20.5, and so on. At each of the timing t52 to a timing t56, the value of the phase error word PEW is therefore "0". This maintains the phase synchronization in the phase-locked loop 1R.

Next, a case where the TDC 22 has the nonlinear conversion characteristic will be described. In the example illustrated in FIGS. 7(A) and 7(B), since the TDC 22 has a linear conversion characteristic, the value of the reference phase word PW1 and the value of the phase word PW2 match with each other at each of timings. However, the value of the reference phase word PW1 and the value of the phase word PW2 may be transiently shifted from each other, when the TDC 22 has the nonlinear conversion characteristic as illustrated in FIG. 4, for example.

FIGS. 8(A) and 8(B) illustrate operation of the phase-locked loop 1R when the TDC 22 has the nonlinear conversion characteristic. In FIGS. 8(A) and 8(B), FIG. 8(A) indicates the value of the phase word D2 outputted by the TDC 22, and FIG. 8(B) indicates the value of the phase error word PEW. In FIGS. 8(A) and 8(B), a horizontal axis indicates time, and one scale corresponds to time for one cycle of the reference clock REFCLK.

The value of the phase word D2 repeats behavior of increasing from "0" to "1", as illustrated in FIG. 8(A). In other words, as with the change (0.1, 0.2, 0.3, 0.4, 0.5, and so on) of the decimal portion of the phase word PW2 illustrated in FIGS. 7(A) and 7(B), the value of the phase word D2 sequentially increases. In this increase, the value of the phase word D2 nonlinearly changes in accordance with the nonlinear conversion characteristic of the TDC 22. In contrast, the value of the reference phase word PW1 linearly increases. The value of the phase error word PEW therefore oscillates at a predetermined cycle, as illustrated in FIG. 8(B). A frequency fn1 of this oscillation may be expressed by the following Expression.

$$fn1 = fref \times n \quad (1)$$

Here, n is the decimal portion of the frequency ratio fratio. For example, the frequency fn1 may become 0.8 [MHz], when fref is 8 [MHz] and the frequency ratio fratio is 4.1 (i.e., n = 0.1). When the frequency fn1 is low within a loop band indicated by a closed loop transfer function in the phase-locked loop 1, the clock signal DCOCLK is modulated with the frequency fn1 by the oscillating circuit 15. In this case, in a frequency spectrum of the clock signal DCOCLK, a spurious signal is generated near the frequency fclk (e.g., fclk±fn1) of the clock signal DCOCLK. This may increase the phase noise of the clock signal DCOCLK.

In contrast, in the phase-locked loop 1 according to the present embodiment, the signal generation circuit 16 generates the clock signal CLK by switching the four clock signals IP, QP, IN, and QN sequentially, and the phase detection circuit 20 detects the phase of the generated clock signal CLK. This makes it possible to reduce likelihood of increase in phase noise, even if the TDC 22 has the nonlinear conversion characteristic, as will be described below.

FIGS. 9(A) and 9(B) illustrate operation of the phase-locked loop 1 when the TDC 22 has the nonlinear conversion characteristic. In FIGS. 9(A) and 9(B), FIG. 9(A) indicates the value of the phase word D2 outputted from the TDC 22, and FIG. 9(B) indicates the value of the phase error word PEW. FIGS. 9(A) and 9(B) correspond to the operation example 1 (FIGS. 5(A), 5(B), 5(C), 5(D) 5(E) and 5(F)).

In FIG. 9(A), a conversion characteristic labeled "IP" indicates a conversion characteristic when the signal generation circuit 16 selects the clock signal IP. Similarly, conversion characteristics labeled "QP", "IN", and "QN" indicate conversion characteristics when the signal generation circuit 16 selects the clock signals QP, IN, and QN, respectively.

The value of the phase word D2 repeats behavior of decreasing from "1" to "0", as illustrated in FIG. 9(A). In other words, as with the change (0.85, 0.7, 0.55, 0.4, 0.25, and so on) of the decimal portion of the phase word PW2 illustrated in FIGS. 5(A), 5(B), 5(C), 5(D) 5(E) and 5(F), the value of the phase word D2 sequentially decreases. In this decrease, the value of the phase word D2 nonlinearly changes in accordance with the nonlinear conversion characteristic of the TDC 22. The value of the phase error word PEW may therefore oscillate at a predetermined cycle, as illustrated in FIG. 9(B).

In contrast, in the phase-locked loop 1 according to the present embodiment, the clock signal CLK is generated by switching the four clock signals IP, QP, IN, and QN sequentially as described above. Hence, it is possible to shorten the cycle of the oscillation of the value of the phase error word PEW, as compared with the cycle (indicated by a broken line in FIG. 9(B)) of the phase-locked loop 1R according to the comparative example 1. It is therefore possible to reduce likelihood of modulation of the clock signal DCOCLK by, for example, setting a high value falling outside the loop band of the phase-locked loop 1 as a frequency fn2 of this oscillation. This makes it possible to reduce likelihood of increase in phase noise of the clock signal DCOCLK.

The frequency fn2 may be expressed by the following Expression.

$$fn2 = fref \times F[VPR - n] \quad (2)$$

Here, VPR is the value of the phase rotation word PRW (the phase rotation value), and a function F is provided to extract only a decimal portion of an argument. For example, the frequency fn2 may become 1.2 [MHz], when fref is 8 [MHz], the frequency ratio fratio is 4.1 (i.e., n=0.1), and the phase rotation value VPR is "+¼".

In this way, in the phase-locked loop 1 according to the present embodiment, the clock signal CLK is generated by switching the four clock signals IP, QP, IN, and QN sequentially. Hence, it is possible to reduce increase in phase noise of the clock signal DCOCLK, even if the TDC 22 has the nonlinear conversion characteristic.

Comparative Example 2

A phase-locked loop 1S according to the comparative example 2 includes a signal generation circuit 16S. The signal generation circuit 16S performs operation different from that of the signal generation circuit 16 according to the present embodiment, when the value of the phase rotation word PRW is "-¼". Other configurations are similar to those of the present embodiment (see FIG. 1).

FIGS. 10(A), 10(B), 10(C), 10(D) 10(E) and 10(F) illustrate operation of the phase-locked loop 1S. In this example, "4.35" is set as the value of the frequency control word FCW, and "-¼" is set as the value of the phase rotation word PRW.

First, at a timing t61, the period PR begins. The signal generation circuit 16S switches the clock signals once in a period from the timing t61 to a timing t65. Specifically, in a period of the timing t61 to a timing t62, the signal generation circuit 16S selects the clock signal IP and outputs the selected clock signal IP as the clock signal CLK. Subsequently, at the timing t62, the signal generation circuit 16S switches from the clock signal IP to the clock signal QN (see FIGS. 10(A), 10(D) and 10(F)).

Next, at a timing t63, the period PR ends, and the phase detection circuit 20 generates the phase word PW2 indicating a value "4.35". At the timing t63, the value indicated by the reference phase word PW1 is "4.35" (=4.35×1). Hence, the phase comparison circuit 13 generates the phase error word PEW having the value "0" by determining a difference between the value "4.35" of the reference phase word PW1 and the value "4.35" of the phase word PW2. This maintains the phase synchronization in the phase-locked loop 1S. Operation is similarly performed at the timing t63 and thereafter.

In the phase-locked loop 1S, at a timing such as at the timing t62, a narrow pulse (a portion W3) appears in the clock signal CLK, when switching of the clock signals is performed. When such a clock signal CLK is inputted, the phase detection circuit 20 may malfunction, and thus may not detect the phase of the clock signal CLK successfully. In such a case, the value of the phase error word PEW may oscillate transiently, which may increase the phase noise of the clock signal DCOCLK.

In contrast, in the phase-locked loop 1 according to the present embodiment, the signal generation circuit 16 performs switching a plurality of times (in this example, three times) in order of IP, QP, IN, QN, and so on, in each of the periods PR, when the value of the phase rotation word PRW is "-¼". In other words, for example, in the period PR from the timing t21 to the timing t25 in FIGS. 6(A), 6(B), 6(C), 6(D) 6(E) and 6(F), the signal generation circuit 16 may not directly switch from the clock signal IP to the clock signal QN. Instead, the signal generation circuit 16 may first switch from the clock signal IP to the clock signal QP, and then from the clock signal QP to the clock signal IN, and then from the clock signal IN to the clock signal QN. This makes it possible to reduce likelihood of decrease in pulse width in the clock signal CLK. This allows for a reduction in likelihood of malfunction of the phase detection circuit 20, and therefore makes it possible to reduce likelihood of increase in phase noise of the clock signal DCOCLK.

[Effects]

In the present embodiment, the clock signals of four phases are sequentially switched as described above. It is therefore possible to reduce likelihood of increase in phase noise of the clock signal DCOCLK, even if the TDC 22 has the nonlinear conversion characteristic.

In the present embodiment, switching is performed a plurality of times in order of IP, QP, IN, QN, and so on in each of the periods PR, when the value of the phase rotation word PRW is "-¼". This makes it possible to reduce likelihood of decrease in pulse width in the clock signal CLK, thereby making it possible to reduce likelihood of increase in phase noise of the clock signal DCOCLK.

Modification Example 1

In the above-described embodiment, the signal generation circuit 16 switches the clock signals three times in order of IP, QP, IN, QN, and so on in each of the periods PR, in a case where "-¼" is set as the value of the phase rotation word PRW (FIGS. 6(A), 6(B), 6(C), 6(D) 6(E) and 6(F)), but is not limited thereto. For example, the signal generation circuit 16 may switch the clock signals twice in the each of the periods PR, as illustrated in FIGS. 11(A), 11(B), 11(C), 11(D) 11(E) and 11(F). In this example, the signal generation circuit 16 outputs the clock signal IP as the clock signal CLK in a period from a timing t71 to a timing t72. At the timing t72, the signal generation circuit 16 switches from the clock signal IP to the clock signal IN, and then at a timing t73, the signal generation circuit 16 switches from the clock signal IN to the clock signal QN. This makes is possible to obtain effects similar to those of the above- described embodiment.

Modification Example 2

In FIGS. 6(A), 6(B), 6(C), 6(D) 6(E) and 6(F), when "-¼" is set as the value of the phase rotation word PRW, the signal generation circuit 16 switches the clock signals a plurality of times in each of the periods PR. However, the switching timing is not limited to the example illustrated in FIGS. 6(A), 6(B), 6(C), 6(D) 6(E) and 6(F). For example, the signal generation circuit 16 may perform switching as illustrated in FIGS. 12(A), 12(B), 12(C), 12(D) 12(E) and 12(F). Specifically, at a timing t82, the signal generation circuit 16 may switch from the clock signal IP to the clock signal QP, and then the clock signal CLK may be reversed. Next, at a timing t83, the signal generation circuit 16 may switch from the clock signal QP to the clock signal IN, and then the clock signal CLK may be reversed. Next, at a timing t84, the signal generation circuit 16 may switch from the clock signal IN to the clock signal QN. This also makes it possible to obtain effects similar to those of the above-described embodiment.

Modification Example 3

In the above-described embodiment, the signal generation circuit 16 generates the clock signals IP, QP, IN, and QN of four phase, but the clock signals are not limited thereto. The signal generation circuit 16 may generate clock signals of three or less phases, or may generate clock signals of five or more phases. A case where clock signals CLK1 to CLK6 of six phases are generated will be described below as an example.

FIGS. 13(A), 13(B), 13(C), 13(D) 13(E) 13(F), 13(G) and 13(H) illustrate an operation example of a phase-locked loop 1C according to the present modification example. In FIGS. 13(A), 13(B), 13(C), 13(D) 13(E) 13(F), 13(G) and 13(H), FIG. 13(A) to 13(F) indicate waveforms of the six clock signals CLK1 to CLK6, respectively. Further, FIG. 13(G) indicates a waveform of the reference clock signal REFCLK, and FIG. 13(H) indicates a waveform of the clock signal CLK. In this example, the control circuit 11 sets "3.933" as the value of the frequency control word FCW, and sets "+⅙" as the value of the phase rotation word PRW. It is to be noted that, in this example, the value of the frequency control word FCW and the value of the phase word PW2 are each expressed in a range up to a third decimal place.

First, at a timing t91, the period PR corresponding to one cycle of the reference clock REFCLK begins. A signal generation circuit 16C of the phase-locked loop 1C switches the clock signals once in a period from the timing t91 to a timing t93. Specifically, the signal generation circuit 16C switches from the clock signal CLK1 to the clock signal CLK2, at a timing t92.

Next, at the timing t93, the period PR ends, and the phase detection circuit 20 generates the phase word PW2 indicating a value "3.933" (=3+0.933). At the timing t93, the value indicated by the reference phase word PW1 is "3.933" (=3.933×1). Hence, the phase comparison circuit 13 generates the phase error word PEW having the value "0" by determining a difference between the value "3.933" of the reference phase word PW1 and the value "3.933" of the phase word PW2. This maintains the phase synchronization in the phase-locked loop 1C. Operation is similarly performed at the timing t93 and thereafter.

FIGS. 14(A), 14(B), 14(C), 14(D) 14(E) 14(F), 14(G) and 14(H) illustrate another operation example of the phase-locked loop 1C. In this example, the control circuit 11 sets "3.267" as the value of the frequency control word FCW, and sets "−⅙" as the value of the phase rotation word PRW.

First, at a timing t101, the period PR corresponding to one cycle of the reference clock REFCLK begins. The signal generation circuit 16C switches the clock signals three times in a period from the timing t101 to a timing t105. Specifically, the signal generation circuit 16C switches from the clock signal CLK1 to the clock signals CLK3, CLK5, CLK6 sequentially in this order, at timings t102, t103, and t104, respectively.

Next, at the timing t105, the period PR ends, and the phase detection circuit 20 generates the phase word PW2 indicating a value "3.267" (=3+0.267). At the timing t105, the value indicated by the reference phase word PW1 is "3.267" (=3.267×1). Hence, the phase comparison circuit 13 generates the phase error word PEW having the value "0" by determining a difference between the value "3.267" of the reference phase word PW1 and the value "3.267" of the phase word PW2. This maintains the phase synchronization in the phase-locked loop 1C. Operation is similarly performed at the timing t105 and thereafter.

In the example illustrated in each of FIGS. 13(A), 13(B), 13(C), 13(D) 13(E) 13(F), 13(G) and 13(H) and 14(A), 14(B), 14(C), 14(D) 14(E) 14(F), 14(G) and 14(H), the value of the phase rotation word PRW is "±⅙", but is limited thereto. The value of the phase rotation word PRW may be, for example, "±²⁄₆" or "±³⁄₆". An example where the value of the phase rotation word PRW is "−²⁄₆" and an example where the value of the phase rotation word PRW is "+²⁄₆" will be described.

FIGS. 15(A), 15(B), 15(C), 15(D) 15(E) 15(F), 15(G) and 15(H) illustrate another operation example of the phase-locked loop 1C according to the present modification example. In this example, the control circuit 11 sets "3.767" as the value of the frequency control word FCW, and sets "+²⁄₆" as the value of the phase rotation word PRW.

First, at a timing t111, the period PR corresponding to one cycle of the reference clock REFCLK begins. The signal generation circuit 16C of the phase-locked loop 1C switches the clock signals once in a period from the timing t111 to a timing t113. Specifically, the signal generation circuit 16C switches from the clock signal CLK1 to the clock signal CLK3, at a timing t112.

Next, at the timing t113, the period PR ends, and the phase detection circuit 20 generates the phase word PW2 indicating a value "3.767" (=3+0.767). At the timing t113, the value indicated by the reference phase word PW1 is "3.767" (=3.767×1). Hence, the phase comparison circuit 13 generates the phase error word PEW having the value "0" by determining a difference between the value "3.767" of the reference phase word PW1 and the value "3.767" of the phase word PW2. This maintains the phase synchronization in the phase-locked loop 1C. Operation is similarly performed at the timing t113 and thereafter.

FIGS. 16(A), 16(B), 16(C), 16(D) 16(E) 16(F), 16(G) and 16(H) illustrate another operation example of the phase-locked loop 1C. In this example, the control circuit 11 sets "3.433" as the value of the frequency control word FCW, and sets "−²⁄₆" as the value of the phase rotation word PRW.

First, at a timing t121, the period PR corresponding to one cycle of the reference clock REFCLK begins. The signal generation circuit 16C switches the clock signals twice in a period from the timing t121 to a timing t124. Specifically, the signal generation circuit 16C switches from the clock signal CLK1 to the clock signals CLK3 and CLK5 sequentially in this order, at timings t122 and t123, respectively.

Next, at the timing t124, the period PR ends, and the phase detection circuit 20 generates the phase word PW2 indicating a value "3.433" (=3+0.433). At the timing t124, the value indicated by the reference phase word PW1 is "3.433" (=3.433×1). Hence, the phase comparison circuit 13 generates the phase error word PEW having the value "0" by determining a difference between the value "3.433" of the reference phase word PW1 and the value "3.433" of the phase word PW2. This maintains the phase synchronization in the phase-locked loop 1C. Operation is similarly performed at the timing t124 and thereafter.

In this way, the signal generation circuit 16C generates the clock signals CLK1 to CLK6 of six phases in the phase-locked loop 1C. This makes it possible to increase flexibility in setting of the phase rotation word PRW. In the phase-locked loop 1C, it is therefore possible to set the frequency fn2 of the oscillation of the phase error word PEW more freely by using Expression (2), even if the TDC 22 has the nonlinear conversion characteristic. This makes it possible to make an adjustment more freely to reduce the phase noise of the clock signal DCOCLK.

Modification Example 4

In the above-described embodiment, the value (the frequency ratio fratio), which is determined by dividing the frequency fclk of the clock signal DCOCLK by the frequency fref of the reference clock signal REFCLK, is "4.1", but is not limited thereto. An example where the frequency ratio fratio is "4.25" will be described.

FIGS. 17(A), 17(B), 17(C), 17(D) 17(E) and 17(F), illustrate an operation example of a phase-locked loop 1D according to the present modification example. In this example, the control circuit 11 sets "4" as the value of the frequency control word FCW, and sets "+¼" as the value of the phase rotation word PRW.

First, at a timing t131, the period PR corresponding to one cycle of the reference clock REFCLK begins. The signal generation circuit 16 switches the clock signals once in a period from the timing t131 to a timing t133. Specifically, the signal generation circuit 16 switches from the clock signal IP to the clock signal QP at a timing t132.

Next, at the timing t133, the period PR ends, and the phase detection circuit 20 generates the phase word PW2 indicating a value "4" (=4+0). At the timing t133, the value indicated by the reference phase word PW1 is "4" (=4×1). Hence, the phase comparison circuit 13 generates the phase error word PEW having the value "0" by determining a difference between the value "4" of the reference phase word PW1 and the value "4" of the phase word PW2. This maintains the phase synchronization in the phase-locked loop 1D. Operation is similarly performed at the timing t133 and thereafter.

FIGS. 18(A), 18(B), 18(C), 18(D) 18(E) and 18(F) illustrate another operation example of the phase-locked loop 1D. In this example, the control circuit 11 sets "3.5" as the value of the frequency control word FCW, and sets "−¼" as the value of the phase rotation word PRW.

First, at a timing t141, the period PR corresponding to one cycle of the reference clock REFCLK begins. The signal generation circuit 16 switches the clock signals three times in a period from the timing t141 to a timing t145. Specifically, the signal generation circuit 16 switches from the clock signal IP to the clock signals QP, IN, and QN sequentially in this order, at timings t142, t143, and t144, respectively.

Next, at the timing t145, the period PR ends, and the phase detection circuit 20 generates the phase word PW2 indicating a value "3.5" (=3+0.5). At the timing t145, the value indicated by the reference phase word PW1 is "3.5" (=3.5× 1). Hence, the phase comparison circuit 13 generates the phase error word PEW having the value "0" by determining a difference between the value "3.5" of the reference phase word PW1 and the value "3.5" of the phase word PW2. This maintains the phase synchronization in the phase comparison circuit 1D. Operation is similarly performed at the timing t145 and thereafter.

Although the present technology has been described above referring to the embodiment and some modification examples, the present technology is not limited thereto, and may be modified in a variety of ways.

For example, in the above-described embodiment and examples, the values of various parameters such as the frequency control word FCW, the phase rotation word PRW, and the frequency ratio fratio are described as examples. However, the values of various parameters are not limited thereto, and may be set as appropriate.

In addition, for example, the present technology may be applied to a frequency synthesizer used for, for example, a wireless communications system. In this case, for example, the frequency control word FCW and the phase rotation word PRW may be switched in accordance with a frequency (a channel) of the clock signal DCOCLK. In this way, the present technology is applicable to various applications including a phase-locked loop.

It is to be noted that the effects described herein are illustrative and non-limiting, and other effects may also be provided.

It is to be noted that the technology may adopt the following configurations.

(1) A phase-locked loop, including
a reference-phase generation circuit that sequentially generates a reference phase value;
an oscillating circuit that generates a first clock on a basis of a difference between the reference phase value and a feedback phase value;
a signal generation circuit that generates, on a basis of the first clock, a plurality of second clocks varying in phase, and generates a third clock by switching the plurality of second clocks a plurality of times in each of cycle periods each corresponding to one cycle of the reference clock; and
a phase detection circuit that determines a phase value of the third clock and outputs the determined phase value as the feedback phase value.

(2) The phase-locked loop according to (1), wherein each of pulses in the third clock has a pulse width equal to or larger than a pulse width of the first clock.

(3) The phase-locked loop according to (1) or (2), wherein the signal generation circuit switches the plurality of second clocks from a currently-selected one of the plurality of second clocks to one of the plurality of second clocks that is lagged in phase behind the currently-selected one of the plurality of second clocks.

(4) The phase-locked loop according to any one of (1) to (3), further including a control circuit that generates a first setting value and a second setting value, wherein
the reference-phase generation circuit sequentially generates the reference phase value on a basis of the first setting value, and
the signal generation circuit switches the plurality of second clocks a plurality of times in a sequence pattern in accordance with the second setting value in each of the cycle periods.

(5) The phase-locked loop according to (4), wherein the control circuit is allowed to generate a plurality of setting value sets each including the first setting value and the second setting value.

(6) The phase-locked loop according to any one of (1) to (5), wherein the phase detection circuit includes
a first detection circuit that determines an integer portion of the phase value, and
a second detection circuit that determines a decimal portion of the phase value.

(7) The phase-locked loop according to (6), wherein the second detection circuit determines the decimal portion of the phase value on a basis of a time difference between a transition timing of the reference clock and a transition timing of the third clock.

(8) The phase-locked loop according to (6) or (7), wherein the first detection circuit determines the integer portion of the phase value by counting number of pulses of the third clock.

(9) The phase-locked loop according to any one of (1) to (8), wherein
the phase-locked loop has a first operation mode and a second operation mode,
the signal generation circuit switches the plurality of second clocks a plurality of times in each of the cycle periods in the first operation mode, and
the signal generation circuit switches the plurality of second clocks once in each of the cycle periods in the second operation mode.

(10) A frequency synthesizer, including:
a reference-phase generation circuit that sequentially generates a reference phase value;
an oscillating circuit that generates a first clock on a basis of a difference between the reference phase value and a feedback phase value;
a signal generation circuit that generates, on a basis of the first clock, a plurality of second clocks varying in phase, and generates a third clock by switching the plurality of second clocks a plurality of times in each of cycle periods each corresponding to one cycle of the reference clock; and
a phase detection circuit that determines a phase value of the third clock and outputs the determined phase value as the feedback phase value.

The present application is based on and claims priority from Japanese Patent Application No. 2014-215271 filed in the Japan Patent Office on Oct. 22, 2014, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A phase-locked loop, comprising:
a reference-phase generation circuit configured to sequentially generate a reference phase value;
an oscillating circuit configured to generate a first clock based on a difference between the reference phase value and a feedback phase value;
a signal generation circuit configured to:
generate a plurality of second clocks based on the first clock, wherein the plurality of second clocks vary in phase; and
generate a third clock based on a switch between the plurality of second clocks a plurality of times in each cycle period of a plurality of cycle periods, wherein each cycle period of the plurality of cycle periods corresponds to one cycle of a reference clock; and
a phase detection circuit configured to:
determine a phase value of the third clock; and
output the phase value as the feedback phase value.

2. The phase-locked loop according to claim 1, wherein a pulse width of the first clock is smaller than a pulse width of each pulse of a plurality of pulses in the third clock.

3. The phase-locked loop according to claim 1,
wherein the signal generation circuit is further configured to switch from a currently-selected clock of the plurality of second clocks to a subsequent clock of the plurality of second clocks, and
wherein the subsequent clock is lagged in phase behind the currently-selected clock.

4. The phase-locked loop according to claim 1, further comprising a control circuit configured to generate a first setting value and a second setting value,
wherein the reference-phase generation circuit is further configured to sequentially generate the reference phase value based on the first setting value, and
wherein the signal generation circuit is further configured to switch between the plurality of second clocks the plurality of times in a sequence pattern based on the second setting value in each cycle period of the plurality of cycle periods.

5. The phase-locked loop according to claim 4,
wherein the control circuit is further configured to generate a plurality of setting value sets, and
wherein each setting value set of the plurality of setting value sets comprises the first setting value and the second setting value.

6. The phase-locked loop according to claim 1, wherein the phase detection circuit comprises:
a first detection circuit configured to determine an integer portion of the phase value; and
a second detection circuit configured to determine a decimal portion of the phase value.

7. The phase-locked loop according to claim 6, wherein the second detection circuit is configured to determine the decimal portion of the phase value based on a time difference between a transition timing of the reference clock and a transition timing of the third clock.

8. The phase-locked loop according to claim 6, wherein the first detection circuit is configured to determine the integer portion of the phase value based on a count of a number of a plurality of pulses of the third clock.

9. The phase-locked loop according to claim 1, wherein the phase-locked loop has a first operation mode and a second operation mode,
the signal generation circuit further configured to:
switch between the plurality of second clocks the plurality of times in each cycle period of the plurality of cycle periods in the first operation mode; and
switch between the plurality of second clocks once in each cycle period of the plurality of cycle periods in the second operation mode.

10. A frequency synthesizer, comprising:
a reference-phase generation circuit configured to sequentially generate reference phase value;
an oscillating circuit configured to generate a first clock based on a difference between the reference phase value and a feedback phase value;
a signal generation circuit configured to:
generate a plurality of second clocks based on the first clock, wherein the plurality of second clocks vary in phase; and
generate a third clock based on a switch between the plurality of second clocks a plurality of times in each cycle period of a plurality of cycle periods, wherein each cycle period of the plurality of cycle periods corresponds to one cycle of a reference clock; and
a phase detection circuit configured to:
determine a phase value of the third clock; and
output the phase value as the feedback phase value.

11. The phase-locked loop according to claim 1, wherein the plurality of second clocks vary in phase from each other by 90 degrees.

12. The phase-locked loop according to claim 1, wherein the phase detection circuit further comprises an addition circuit configured to add an integer portion of the phase value and a decimal portion of the phase value.

13. The phase-locked loop according to claim 12, wherein the phase detection circuit is further configured to determine the phase value based on the addition.

14. A phase-locked loop, comprising:
a reference-phase generation circuit configured to sequentially generate a reference phase value;
an oscillating circuit configured to generate a first clock based on a difference between the reference phase value and a feedback phase value;
a signal generation circuit configured to:
generate a plurality of second clocks based on the first clock, wherein the plurality of second clocks vary in phase; and
generate a third clock based on a switch between the plurality of second clocks at a plurality of times in each cycle period of a plurality of cycle periods, wherein each cycle period of the plurality of cycle periods corresponds to one cycle of a reference clock; and
a phase detection circuit configured to:
determine a phase value of the third clock; and
output the phase value as the feedback phase value,
wherein the phase detection circuit includes:
a first detection circuit configured to determine an integer portion of the phase value; and
a second detection circuit configured to determine a decimal portion of the phase value.

15. A phase-locked loop, comprising:
a reference-phase generation circuit configured to sequentially generate a reference phase value;

an oscillating circuit configured to generate a first clock based on a difference between the reference phase value and a feedback phase value;
a signal generation circuit configured to:
  generate a plurality of second clocks based on the first clock, wherein the plurality of second clocks vary in phase; and
  generate a third clock based on a switch between the plurality of second clocks a plurality of times in each cycle period of a plurality of cycle periods, wherein each cycle period of the plurality of cycle periods corresponds to one cycle of a reference clock; and
a phase detection circuit configured to:
  determine a phase value of the third clock; and
  output the phase value as the feedback phase value,
wherein the phase-locked loop has a first operation mode and a second operation mode, and wherein the signal generation circuit further configured to:
  switch between the plurality of second clocks the plurality of times in each cycle period of the plurality of cycle periods in the first operation mode; and
  switch between the plurality of second clocks once in each cycle period of the plurality of cycle periods in the second operation mode.

* * * * *